(12) United States Patent
Li

(10) Patent No.: US 8,209,136 B2
(45) Date of Patent: Jun. 26, 2012

(54) ENHANCED PRECISE LOCATION

(75) Inventor: Kun Li, Cupertino, CA (US)

(73) Assignee: Metrotech Corporation, Inc., Santa Clara, CA (US)

( * ) Notice: Subject to any disclaimer, the term of this patent is extended or adjusted under 35 U.S.C. 154(b) by 208 days.

(21) Appl. No.: 12/122,136

(22) Filed: May 16, 2008

(65) Prior Publication Data

US 2008/0309315 A1    Dec. 18, 2008

Related U.S. Application Data

(60) Provisional application No. 60/930,753, filed on May 18, 2007.

(51) Int. Cl.
*G01B 5/30* (2006.01)

(52) U.S. Cl. ............... 702/38; 702/59; 702/67; 702/33; 702/35; 702/57; 702/58; 324/67

(58) Field of Classification Search .................. 702/38, 702/59; 324/67
See application file for complete search history.

(56) References Cited

U.S. PATENT DOCUMENTS

| | | | |
|---|---|---|---|
| 5,194,812 A * | 3/1993 | Yokoi | ........................... 324/326 |
| 6,411,073 B1 | 6/2002 | Fischer et al. | |
| 6,725,161 B1 | 4/2004 | Hillis et al. | |
| 7,057,383 B2 | 6/2006 | Schlapp et al. | |
| 7,062,414 B2 | 6/2006 | Waite et al. | |
| 7,113,124 B2 | 9/2006 | Waite | |
| 7,120,564 B2 | 10/2006 | Pacey | |
| 7,356,421 B2 | 4/2008 | Gudmundsson et al. | |
| 2005/0248333 A1 * | 11/2005 | Schlapp et al. | ............... 324/67 |
| 2006/0036376 A1 * | 2/2006 | Gudmundsson et al. | ...... 702/38 |
| 2006/0077095 A1 | 4/2006 | Tucker et al. | |
| 2009/0128156 A1 | 5/2009 | Li | |

OTHER PUBLICATIONS

Radiodetection Corporation and Detection Ltd "Theory of Buried Pipe and cable location," (1986).*
Noro, JP11055857 (English abstract only).*
Takano, JP10022855 (English abstract only).*
Office Action mailed Jun. 4, 2010, in related U.S. Appl. No. 12/209,999.
Fletcher, R., "Practical Methods of Optimization", 2nd Ed., John Wiley & Sons, 1987 (2003 is a re-print of this second edition).

* cited by examiner

*Primary Examiner* — Drew A Dunn
*Assistant Examiner* — Hyun Park
(74) *Attorney, Agent, or Firm* — Haynes and Boone, LLP

(57) ABSTRACT

A line locator includes a signal detector to detect signals from an underground line; an error modeler that models a phase error in the signal from neighboring underground lines; and an enhanced electromagnetic field modeler that provides a location of the underground line based on the signal and a result from the error modeler.

51 Claims, 7 Drawing Sheets

ENHANCED PRECISE LOCATION

BENEFIT OF PRIORITY

This application claims the benefit of Provisional Application No. 60/930,753, filed May 18, 2007, which is incorporated herein by reference in its entirety.

BACKGROUND

1. Field of the Invention

The present invention relates to detection of electromagnetic (EM) signals from targeted concealed conductors and, in particular, to the precise location of such conductors in the presence of signal distortion.

2. Discussion of Related Art

Utility conduits are often buried underground and not readily accessible. It is often necessary to locate these concealed utility conduits in order to repair and replace them. It is also important to know the location of utility conduits so that excavators can avoid them while excavating an area. If these locations are not accurate for an excavation, harmful results may occur such as property damage, serious physical harm to a person, or even death.

In an attempt to overcome these harmful results, there are various ways to locate concealed conduits, for example, using pipe and cable locators. Underground pipe and cable locators (sometimes termed line locators) have existed for many years and are well known. Line locator systems typically include a mobile receiver and a transmitter. The transmitter can be coupled to a target conductor, either by direct electrical connection or through induction, to provide a current signal on the target conductor. The receiver detects and processes signals resulting from the EM field generated at the target conductor as a result of the current signal. The signal detected at the line locator can be a continuous wave sinusoidal signal provided to the target conductor by the transmitter.

The transmitter is often physically separated from the receiver, with a typical separation distance of several meters or in some cases up to many kilometers. The transmitter couples the current signal, whose frequency can be user selected from a selectable set of frequencies, to the target conductor. The frequency of the current signal applied to the target conductor can be referred to as the active locate frequency. The target conductor generates an EM field at the active locate frequency in response to the current signal.

Different location methodologies and underground environments can call for different active frequencies. The typical range of active locate frequencies can be from several Hertz (for location of the target conductor over separation distances between the transmitter and receiver of many kilometers) to 100 kHz or more. Significant radio frequency interference on the EM field detected by the receiver can be present in the environment over this range. Therefore, receivers of line location systems have often included highly tuned filters to preclude interference from outside sources from affecting the measurement of signals at the desired active locate frequency from the target conductor. These filters can be tuned to receive signals resulting from EM fields at each of the selectable active locate frequencies and reject signals resulting from EM fields at frequencies other than the active locate frequencies.

In line location systems, the signal strength parameter determined from detection of the EM field provides a basis for derived quantities of the current signal (i.e., the line current in the targeted conductor), the position of the line locator receiver relative to the center of the conductor, the depth of the conductor from the line locator receiver, and the input to a peak or null indicator (depending on the orientation of the electromagnetic field to which the detector is sensitive). Line location systems measure signal strength at one or more active frequencies, also referred to as measurement channels.

For detection of cables or pipes laying in a continuous path (e.g., buried in a trench or occupying an underground conduit extending over some distance), an assumption is often made that the induced electromagnetic field is concentric around the cable and that signal strength depends only on the local ground conductivity, the depth and horizontal position of the target cable, and the magnitude of AC current flowing in the cable. When this is the case, the EM field at the detector of the line locator, on which the signal strength depends, is said to be free of distortion.

Nearly all locating systems present a "peak" indication that results from a horizontally-oriented coil, with axis orthogonal to the direction of the cable, that has a maximum deflection over the presumed centerline of the cable, assuming the ideal undistorted field. Some locating systems also present a "null" output from a vertically-oriented coil, which has a minimum at the same position, again making the same ideal assumption about the electromagnetic field. Moreover, some locating systems also provide a top-oriented coil to further assist in estimating a conductor lateral position and depth using a non-linear optimization algorithm.

Often in a crowded underground utility environment of metallic pipes and cables, coupling of signals at the active locating frequency from the target conductor to other adjacent underground conductors can occur. These conductors (lines) are not intended to be tracked by the line location system, but coupling of currents from the target conductor to those neighboring conductors through various means (resistive, inductive, or capacitive), termed "bleedover," can lead a line locator astray such that the operator of the line location system ceases tracking the targeted conductor (e.g., pipe or cable of interest) and instead begins following an adjacent line. In some cases, there may be bias in the targeted conductor's estimated centerline as a result of distortion due to bleedover.

In conventional receivers, it is very difficult to determine whether the receiver is tracking the targeted conductor or whether the receiver is erroneously tracking a neighboring conductor. Therefore, there is a need for refinement of walkover line location systems to allow for more precise locating of an underground conductor in the presence of distortion due to significant bleedover to other conductors. As stated above, the more precise a locating can be, the less likely that property damage, physical injury, or even death will occur due to an erroneous locate.

SUMMARY

Consistent with some embodiments of the present invention, a line locator system used in walkover locate mode is presented that can more accurately provide a precise centerline and depth of the targeted conductor even in the presence of high field distortion due to bleedover.

Some embodiments of the invention provide a line locator including a plurality of coil detectors, each of the plurality of coil detectors oriented to measure a component of an electromagnetic field; circuitry coupled to receive signals from the plurality of coil detectors and provide quadrature signals indicating a complex electromagnetic field strength; a position locator for indicating a position of the line locator; a processor coupled to receive the complex electromagnetic field strength and the position and calculate values related to a target line; a memory configured to store instructions; and a display coupled to the processor, the display indicating to a user the values related to the target line. Further, the processor executes the instructions for performing the following: modeling an expected complex field strength corresponding to complex field strengths and a phase error measured at the plurality of coil detectors at each of a plurality of positions determined by the position locator with the target line and a hypothesized number of bleedover cables to form a set of hypothesized values corresponding to a set of individual models for the target line for each of the hypothesized number of bleedover cables; determining which of the set of individual models is a best model; and determining parameters related to the target line from the best model.

Some embodiments of the present invention provide a method of locating an underground line. The method includes measuring an electromagnetic field; modeling a phase error based on the presence of lines neighboring the underground target line; and utilizing the phase error in an enhanced electromagnetic field model to locate the target line.

Some embodiments of the present invention also provide a line locator. The line locator includes a signal detector to detect signals from an underground line; an error modeler that models a phase error in the signal from neighboring underground lines; and an enhanced electromagnetic field modeler that provides a location of the underground line based on the signal and a result from the error modeler.

These and other embodiments are further discussed below with reference to the following figures.

In the figures, elements having the same designation have the same or similar functions. Elements in the figures are not drawn to scale.

DETAILED DESCRIPTION

The following exemplary embodiments describe using several parameters used by a line locator to more accurately locate a concealed line. These parameters can include the following:

$$a = [x, z, I, \phi, dI, d\phi]$$

where, x is the horizontal position of each line (whether it be the target line and/or any bleedover lines);
z is the vertical position (depth) of each line;
I is the current of each line;
$\phi$ is the phase for each line;

dI is the current difference between two nearest side tones; and $d\phi$ is the phase difference between the two nearest side tones.

Figure 1:
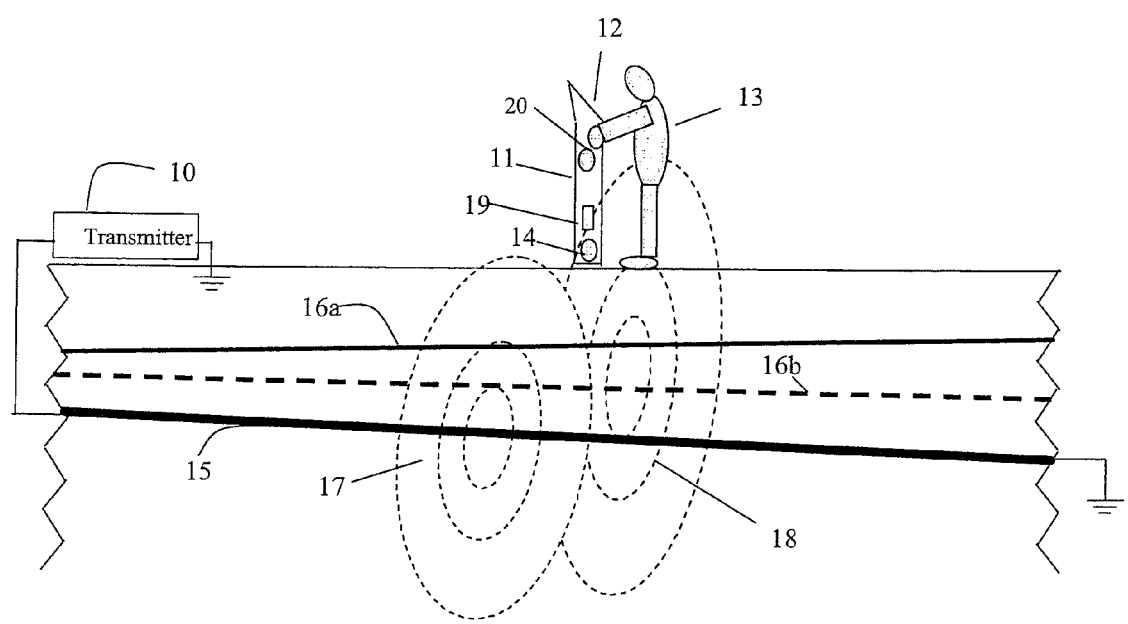
FIG. 1 illustrates the aboveground use of a locate receiver consistent with some embodiments of the present invention to locate the position of an underground targeted conductor in the presence of bleedover to an adjacent conductor.

FIG. 1 illustrates a line location environment with a line locator 11 (also referred to as "receiver"). A target line 15 energized by an electric current from transmitter 10 emits an electromagnetic (EM) field 17. EM field 17 induces a current in nearby bleedover conductors such as lines 16a and 16b (collectively lines 16) because of resistive, inductive, or capacitive bleedover. The bleedover currents in lines 16 also emit an EM field 18. There may be any number of lines 16.

The sum of fields generated from lines 16 and line 15 can be detected at the surface by EM detector coils such as EM detector coils 14, 19, and 20 of line locator 11. If locator 11 includes horizontal coil 14, vertical coil 19, and top coil 20, three orthogonal sets of measurements of the strength of the EM field as a function of position over the target line can be obtained. Further, a coil orthogonal to the horizontal and vertical (not illustrated in this figure; e.g., illustrated as orthogonal coil 24 of FIG. 2) can be used to measure the electromagnetic field lying in the plane defined by horizontal coil 14, vertical coil 19, and/or top coil 20. In general, line locator 11 may include any number of detector coils.

Using a walkover locate method, field measurements can be detected at multiple positions of line locator 11 as an operator 13 walks transversely across target line 15. With the enhanced model-based method described below, the centerline, depth, and current in target line 15 can be computed and presented to operator 13 on a display 12.

Although line locator 11 illustrated in FIG. 1 is a hand-held locator, embodiments of a line locator consistent with the present invention can be mounted on vehicles, pullcarts, or included in other devices that can be moved relative to target line 15. Line locator 11 is movable for sampling the EM field generated by target line 15 and bleedover lines 16 that significantly contribute to the EM field sampled by line locator 11.

It is often difficult to distinguish signals resulting from target line 15 and from neighboring conductors (sometimes referred to as bleedover lines) 16a and 16b where bleedover has occurred, even if the receiver of line locator 11 provides an indication of the signal direction as well as signal strength. A system that provides an indication of the signal direction as well as signal strength is described in U.S. patent application Ser. No. 10/622,376, by James W. Waite and Johan D. Överby (the '376 application), which is assigned to Metrotech Corporation and herein incorporated by reference in its entirety.

U.S. patent application Ser. No. 10/842,239, by Hubert Schlapp and Johan D. Överby (the '239 application), which is assigned to Metrotech Corporation and herein incorporated by reference in its entirety, discloses a signal processing structure called "bleedover decoupling" for allowing a line locator system to distinguish between signals received from a targeted line 15 and signals received as a result of bleedover from neighboring lines 16. The '239 application also describes an example of a "walkover" technique.

In the '239 application, a "walkover locate" algorithm is described that utilizes a bleedover decoupling processing system to create more accurate estimates of centerline, depth, and current. The walkover locate process includes repeated quadrature measurement of the electromagnetic field as a function of a transect distance, i.e., as the receiver moves transversely above a target cable such as target line 15. The data are fit to a model using a numerical optimization approach, and from the model the cable centerline, depth, and current estimates are obtained.

Systems disclosed in the '239 application represent an important advance in the detection and reporting of signal distortion due to bleedover. However, in the particular case of long haul cables resident in ducts with many other cables, the effect of the phase transfer function that occurs between the locating system transmitter 10 and locator 11, the estimation of confidence bounds for centerline and depth estimates, and the rejection of false positive locates due to the presence of noise and interference were not discussed. The disclosure in the '239 application focused on the demodulation method used to determine the phase of the bleedover signal, but did not address the case where the induced electromagnetic field has nulls where the measurable field disappears. At the null points, the digital phase locked loop ("DPLL") described in the '376 application can fail to hold a lock to the transmitter signal and the measurement results can become imprecise for some distance segment around the location where there is a null in the EM field. Therefore, further corrections can be made to the bleedover calculation so that more accurate prediction of true centerline and depth of the conductor results.

U.S. patent application Ser. No. 11/100,696, by Thorkell Gudmundsson, Johan D. Överby, Stevan Polak, James W. Waite, and Niklas Lindstrom (the '696 application), which is assigned to Metrotech Corporation and herein incorporated by reference in its entirety, discloses a signal processing structure for refining models to account for the phase transfer function occurring between system transmitter 10 and locator 11 along targeted line 15, for the present confidence bounds for both the centerline and depth estimates. These models also reject false positive locates due to the presence of noise and interference in the environment. Furthermore, to account for the presence of an arbitrarily complex electromagnetic field (again, due to distortion), the refinements help ensure that the estimates of electromagnetic field strength are more accurate over the entire walkover to avoid systematic errors in the field modeling and resulting biases in the estimates of centerline and depth.

The embodiments disclosed in the '696 application represent an important advance in the detection and reporting of signal distortion due to bleedover. However, those embodiments did not address utilizing an enhanced electromagnetic field model including a phase measurement error term to precisely locate an underground object.

The refinement of the models disclosed herein can account for a phase measurement error term used to more precisely locate an underground object. In some embodiments, the phase error term can be modeled as a function of location, current, and phase of each cable in addition to a current amplitude and phase variation.

As stated above, transmitter 10 applies a current signal, whose frequency can be user selected from a selectable set of frequencies, to target line 15. The frequency of the current signal applied to the target conductor can be referred to as the active locate frequency. Target line 15 generates EM field 17 at the active locate frequency in response to the current signal. The phase of a tone (e.g., current signal of a determined frequency) placed on a line 15 by transmitter 10 carries information that may be used by locator 11 to determine the degree of signal distortion, as well as the direction of the signal. Locator 11 measures the signal phase relative to a reference signal detectable at locator 11. This reference signal may be transmitted to locator 11 separately from a signal source (such as via an aboveground cable or wireless radio link between transmitter 10 and locator 11), may be determined from an independent synchronized time source (such as a global positioning system (GPS)), or may be embedded in the signal measured from line 15 itself. The latter approach requires no external equipment or wires to implement.

Any transmission medium can affect the phase of a tone traveling along it. This effect is a function of the electrical characteristics of the medium, the distance the signal travels, and the frequency of the tone. For long-haul fiber cables with metallic sheaths and a tone signal frequency above a few Hz, this distortion can become significant. Both measurement and transmission-line models indicate that the phase can easily change by about 1° to about 3° for each mile traveled and depends on local soil conditions, making the phase at a locate site somewhere on a 50 mile cable run difficult to determine. Soil dampness and the cable termination impedance can particularly affect phase distortion. In particular, non-uniform soil conditions, such as conductivity, lead to non-uniform phase distortion along a cable, and different termination impedances lead to further distortion near the termination.

Bleedover distortion at a locate site generally results from an interplay of several complex phenomena. An approach for separating this distortion from the main signal from target line 15 when the phases of the two differ by 90° is described in the '239 application. In some cases (as for long-haul fiber optic cables collocated in duct structures), the distortion is not necessarily orthogonal to the signal from target line 15, so the distortion cannot be fully removed without further correction. In particular, unless the bleedover signal is almost 90° out of phase with the signal from target line 15, a significant distortion component can be present in the in-phase part of the measured field. This bleedover component may appear as a positive or negative current in the bleedover cable, depending on the exact phase offset of the bleedover signal. Thus, a measurement of the current due to bleedover by locator 11 as described in the '239 application may appear similar to a measurement of resistively-coupled "return current" (i.e., current that results from a galvanic connection to the target cable, likely because of a common ground at a splice).

To accurately identify the depth and centerline of target line 15, the presence of non-orthogonal bleedover can be incorporated into the optimization method disclosed in the '239 application. As disclosed herein, the model presented in the '239 application is extended using a generalized formulation that vectors an aggregate measurement of the electromagnetic field to one target line 15 by decoupling the influence of additional bleedover cables (such as lines 16, for example) that are hypothesized to exist and by taking into consideration the phase error measurement term. This bleedover decoupling model can be solved via a non-linear numerical optimization method, such as the Levenberg-Marquardt algorithm and other model-based methods (R. Fletcher, "Practical Methods of Optimization", Wiley, 2003.).

The EM field measurements at line locator 11 are complex values and represent the aggregate phase of the electromagnetic field measurement at the particular aboveground position of the measurement. To show this, the constituent parts of the EM field can be modeled as a sum of the constituent individual electromagnetic fields. The field measured at locator 11 is distorted from that generated by the primary cable (target line 15) by fields generated by nearby cables, such as lines 16, that carry bleedover current induced by target line 15 and/or return current through a common ground connection. Therefore, the measured EM field at line locator 11 is a summation of three terms, $$h_{measured} = h_{primary} + h_{return} + h_{bleedover}, \quad (1)$$

where $h_{primary}$ is the electromagnetic field generated by target line 15, $h_{return}$ is the electromagnetic field generated by return current to transmitter 10, and $h_{bleedover}$ is the electromagnetic field generated by bleedover cables such as lines 16a and 16b shown in FIG. 1.

To correctly model Equation (1), an operator should estimate the phase of the EM field generated by each cable. This estimation can be done using the signal select modulation scheme (as described in U.S. Pat. No. 6,411,073, which is herein incorporated by reference in its entirety) and the bleedover decoupling signal processing scheme described in the '239 application. Using these approaches, the phase of the EM field measured at line locator 11 can be determined, relative to a reference imparted at transmitter 10. A resistive model best describes the galvanic (direct) coupling related to the terms $h_{primary}$ and $h_{return}$. In this case, the electromagnetic field can be added directly using only a sign change for whether the current in the cable is flowing in a forward or reverse direction (phase 0° or 180°).

Bleedover models for $h_{bleedover}$ vary depending on the coupling mechanism. Inductive or capacitive coupling (or a combination of both) can occur to other co-located cables as well. The phase of the signal from a cable carrying bleedover current is not as constrained as for resistive coupling. Furthermore, strong return currents can be the source of bleedover, resulting in an ambiguity in the sign of the bleedover phase. Therefore, for the purpose of this discussion, $h_{return}$ and $h_{bleedover}$ are treated as indistinguishable, since each can be composed of both in-phase and quadrature components.

An unknown and not insignificant phase offset exists for long cables, for example, cables over several kilometers in length. This offset phase θ can be modeled by a uniform rotation of all the individual cable phases at the measurement location by the same amount. In a system identification framework, the offset phase θ can be viewed as the phase transfer function between transmitter 10 and line locator receiver 11, which can be separated by significant distances (tens of kilometers) in some cases.

Therefore, Equation (1) can be rewritten as:

$$h_{measured} = e^{i\theta}(h_{primary} + h_{inphase} + h_{quadrature}) \quad (2)$$

Generally $h_{primary}$ is real (with zero phase), as is $h_{inphase}$ by definition. An exception to this is when the conductivity of the ground in which the cables are buried is high. In that case, the electromagnetic field induced by the primary current may not be completely in-phase and the bleedover field can be further distorted.

To estimate the location of target line 15, several of the electromagnetic field measurements can be taken as locator 11 is traversed over a cross-section of target line 15. These measurements, along with the horizontal coordinates at which they are taken, are then matched with a model of the electromagnetic field generated by the system of underground lines (target line 15 and surrounding bleedover lines 16) as a function of position to estimate the depth of line 15 and the horizontal centerline coordinate. In addition, an estimate of the current in line 15 and the soil conductivity may be extracted from the results.

The model consistent with some embodiments of the present invention assumes that target line 15 is locally long enough that the induced electromagnetic field is cylindrical. A further assumption is that target line 15 and bleedover lines 16 are substantially parallel. If this latter assumption is incorrect, the model may not accurately estimate the locations of bleedover lines 16. However, identifying the locations of bleedover lines 16 is not the goal. The accurate location of target line 15 can still be obtained even if the locations of the bleedover cables are inaccurate.

Each field source generates a radially decaying field according to the equation:

$$h(r) = \frac{I}{2\pi} \int_0^\infty \frac{2\xi e^{-r\sqrt{\xi^2 + 2j\delta^{-2}}}}{\xi + \sqrt{\xi^2 + 2j\delta^{-2}}} d\xi, \quad (3)$$

where r is the distance from the source, $j = \sqrt{-1}$, and δ is the skin depth of the ground at the signal frequency, where $$\delta = \frac{1}{\sqrt{\pi \mu \sigma f}}, \quad (4)$$

where,

μ = permeability of free space ($4\pi 10^{-7}$),
σ = conductivity of the ground, and
f = signal frequency in Hz.

If the source of an electromagnetic field from a long conductor is at depth z and centerline x, and this field is measured by a horizontal coil 14 at x-coordinate $x_n$, the coil is oriented at an angle γ with respect to the full field, where $$\cos\gamma_n = \frac{z}{r_n} \quad (5)$$
$$r_n^2 = (x_n - x)^2 + z^2.$$

So the measurement at the $n^{th}$ position would be $$h_n = h(r_n)\frac{z}{r_n}. \quad (6)$$

In general, the measurement is a complex number, representing the non-zero phase of the signal.

In the limit when σ goes to 0, Equation (6) reduces to:

$$h_n = \frac{Iz}{2\pi r_n^2} \quad (7)$$

In an ideal world, the electromagnetic field generated by a buried cable carrying a current $I_0$ measured by a horizontal coil at position ($x_j$, z=0) can be modeled as follows:

$$h_n(x_j) = \frac{z_0 I_0 \cos(\omega t + \phi_0)}{(x_j - x_0)^2 + z_0^2} \quad (8)$$

where,
$z_0$ is the depth of the primary cable;
$x_0$ is the centerline of the primary cable;
$I_0 \cos(\omega t + \phi_0)$ is the primary current;
ω is the active locate frequency; and
$\phi_0$ is the channel phase distortion at ω.

If a vertically oriented coil is used to measure the field strength rather than the horizontal peak coil, the optimization takes a slightly different form:

$$h_v(x_j) = \frac{(x_j - x_0)I_0\cos(\omega t + \phi_0)}{(x_j - x_0)^2 + z_0^2} \quad (9)$$

Moreover, the electromagnetic field measured by top coil can be modeled as follows:

$$h_t(x_j) = \frac{(z_0 + h)I_0\cos(\omega t + \phi_0)}{(x_j - x_0)^2 + (z_0 + h)^2} \quad (10)$$

where h is the vertical distance between the horizontal and top coils. Likewise, expressions for the field strength can be derived if the sensing coils are mounted at other arbitrary geometric angles.

Figure 2:
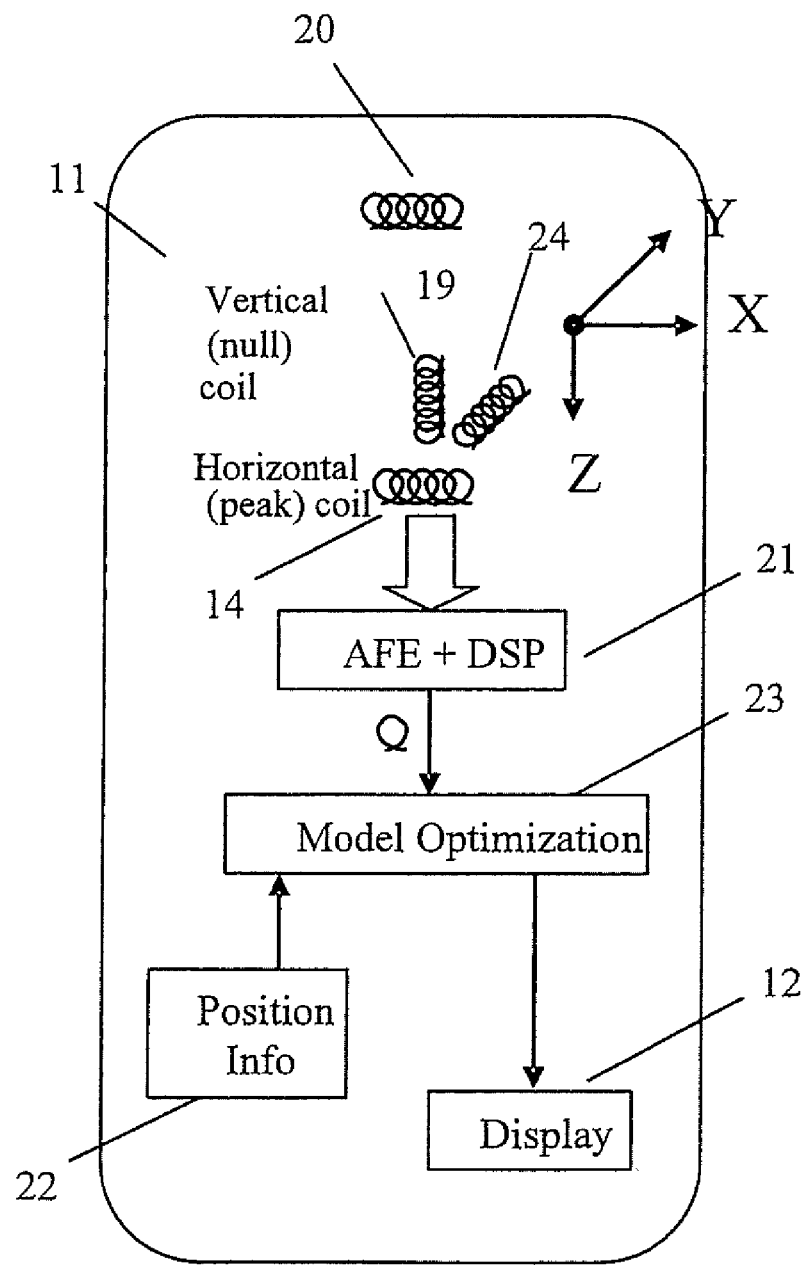
FIG. 2 illustrates a block diagram of a locator receiver consistent with some embodiments of the present invention.

FIG. 2 illustrates an embodiment of locator 11 consistent with embodiments of the invention. The embodiment of locator 11 shown in FIG. 2 includes sensing coils 14, 19, 20, and 24, although any number of sensing coils oriented in any orientations can be included. Sensing coils (or detectors) 14, 19, and 20 are coupled to analog front-end (AFE) electronics 21. AFE electronics 21 provides signal conditioning, including amplification, alias protection, and interference filtering prior to analog-to-digital conversion. A digital signal processor implements the phase and field strength amplitude detection algorithm described in the '239 application. These results, as well as distance measurements from a position info 22, are provided to a model optimization 23. The output signal from AFE electronics 21 is also input to model optimization 23. Model optimization 23 optimizes the model utilized to estimate unknown parameters and provides the estimated parameters to display 12 for presentation.

Figure 3:
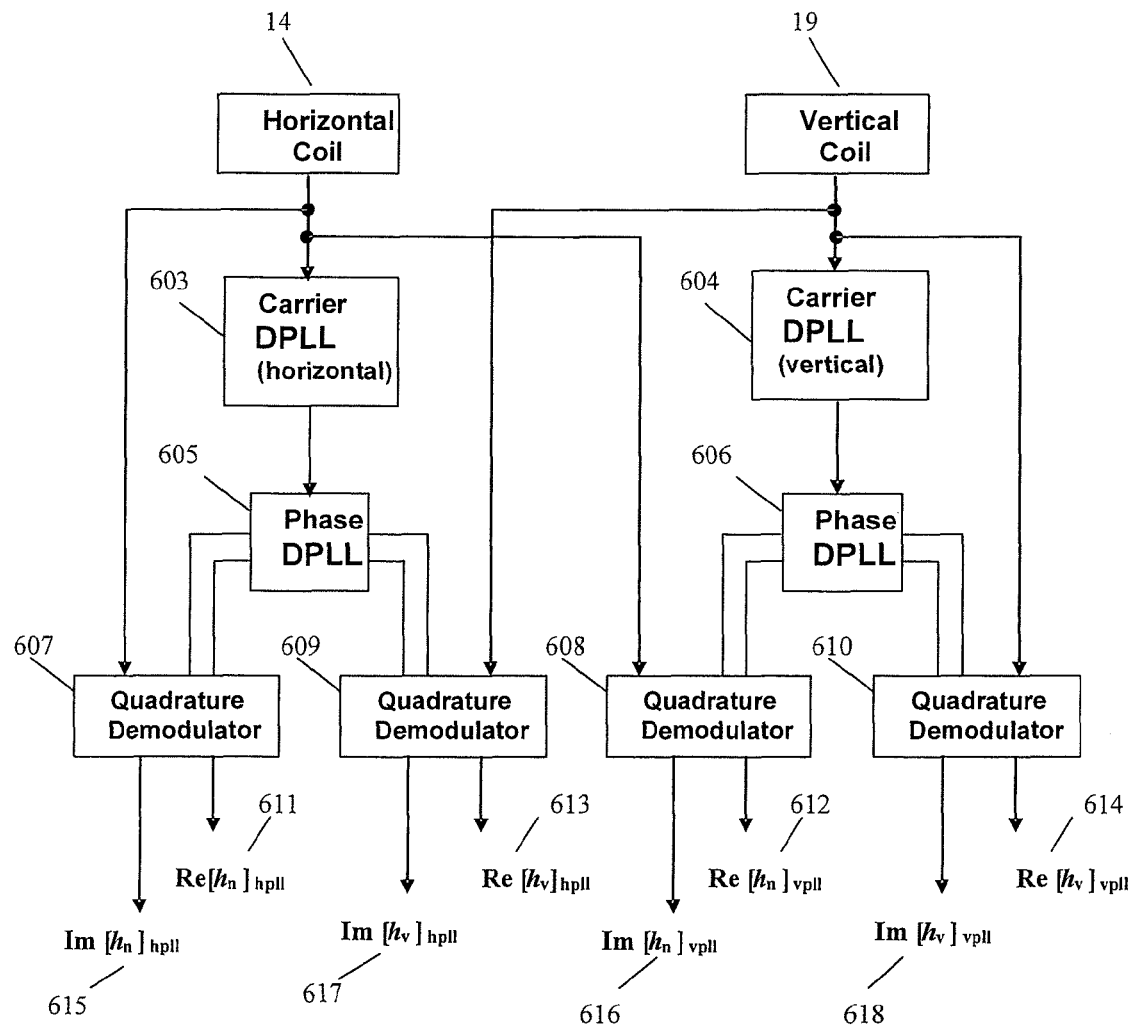
FIG. 3 illustrates the processing flow for a locator consistent with some embodiments of the present invention.

FIG. 3 illustrates the processing flow for a locator consistent with some embodiments of the present invention. Because in a highly distorted field, sharp nulls can exist at various points in the walkover, a dual, nested, digital phase locked loop (DPLL, as described in the '376 application) can be separately connected to each of detector coils 14 and 19, which in turn is used to demodulate both sets of complex measurements of $h_n$, $h_v$, from the horizontal and vertical coils. While detector coils 14 and 19 are illustrated in this embodiment for simplicity purposes, one of ordinary skill in the art would appreciate implementing one or more additional coils, such as top coil 20, along with its corresponding DPLLs into this embodiment as well. Nested PLL pairs formed by DPLL 603 and DPLL 605 and by DPLL 604 and DPLL 606 are used to demodulate the phase signal from coils 14 and 19, respectively. To ensure that a solid phase lock is obtained for every x-position at which measurements are taken, duplicate field strength signals can be computed for each of coils 14 and 19. In this way, each walkover generates two pairs of complex signals, $[h_n, h_v]_{hpll}$ (611, 613, 615, and 617) and $[h_n, h_v]_{vpll}$ (612, 614, 616, and 618), where the hpll and vpll subscripts denote which digital phase locked loop was used in processing.

The field optimization model utilized in model optimization 23 can use the complex field strength vector (with independent variable $x_n$) for the signal strength measured at each of coils 14 and 19. Thus, it is possible to define a selection method (per each $x_n$) of which pair of $[h_n, h_v]$ signals to use. In some embodiments the field strength signal magnitudes can be compared (element by element), progressively building the output field strength vector from either the hpll and vpll generated values based upon which is larger than the other by a defined margin. In the end, given a reasonably good amplitude and phase calibration of the PLLs downstream from detector coils 14 and 19, the complex vector of field strength used as input to optimization 23 can be arbitrarily constructed of measurement segments that embody the most accurate field strengths. This method minimizes the places in the walkover where sharp nulls in the EM field degrade the quality of the measurement.

Position info 22 of FIG. 2 provides the current position information $x_n$ to model optimization 23. The measured values of $x_n$ can be obtained in a variety of ways. In some embodiments, the transect distance increments are computed in situ (within the locate receiver) at the same time intervals that drive the measurement of EM field strength from coils 19 and 14. Inertial methods such as, for example, from accelerometers, gyroscopes, and digital compasses are the best example of this class of distance measurement devices. However, on-board rangefinders, stereo imaging systems, and measuring wheels also can be utilized because they do not require a separate device to be managed by the locate technician. A line locator that includes an inertial position-tracking device is described in U.S. patent application Ser. No. 10/407, 705 "Buried Line Locator with Integral Position Sensing", herein incorporated by reference, by Gordon Pacey and assigned to Metrotech Corporation, which is herein incorporated by reference in its entirety. U.S. patent application Ser. No. 10/997,729 "Centerline and Depth Locating Method for Non-Metallic Buried Utility Lines," by James W. Waite and assigned to Metrotech Corporation, discloses utilization of inertial sensors to result in transverse (to the line) position estimates $x_n$.

Clearly, simple methods like electromagnetic or optical detection of tick marks on a tape, or simply pressing a button on every desired measurement interval (as determined by a tape measure) can also be used to collect the $x_n$ array during the walkover transect. Yet other methods utilized in position info 22 may make assumptions about the walkover speed being constant, and thus use elapsed time to derive position estimates $x_n$. These methods may be appropriate, especially where line locator 11 is mounted and towed at constant velocity.

Onboard inertial measurement units can also be useful in being able to detect pitch and yaw angles from the ideal walkover transect direction, as might occur during a walkover using a handheld receiver. As such, position info 22 can provide pitch and yaw information to model optimization 23. Pitch and yaw angles can be used to correct the field measurements to represent a fixed direction or, alternatively, the field model can be extended to incorporate the pitch and yaw information.

In the presence of multiple bleedover cables, the optimization algorithm matches the measured horizontal coil data to the following model, derived from Equation (8), representing the target cable and a number of secondary cables that contribute to the μM field through bleedover:

$$h_n(x_j) = \frac{z_0 I_0 \cos(\omega t + \phi_0)}{(x_j - x_0)^2 + z_0^2} + \sum_{k=1}^{M} \frac{z_k I_k \cos(\omega t + \phi_k)}{(x_j - x_k)^2 + z_k^2} \quad (11)$$

where,
M is the number of secondary cables;
$z_k$ is the depth of the $k^{th}$ secondary cable;
$x_k$ is the centerline of the $k^{th}$ secondary cable; and
$I_k \cos(\omega t + \phi_k)$ is the current in the $k^{th}$ secondary cable.

Similarly, from Equation (9), the EM field sensed by the vertical coil can be modeled as:

$$h_n(x_j) = \frac{(x_j - x_0)I_0\cos(\omega t + \phi_0)}{(x_j - x_0)^2 + z_0^2} + \sum_{k=1}^{M} \frac{(x_j - x_k)I_k\cos(\omega t + \phi_k)}{(x_j - x_k)^2 + z_k^2} \quad (12)$$

and, from Equation (10), the electromagnetic filed sensed by the top coil can be modeled as:

$$h_n(x_j) = \frac{(z_0 + h)I_0\cos(\omega t + \phi_0)}{(x_j - x_0)^2 + (z_0 + h)^2} + \sum_{k=1}^{M} \frac{(z_k + h)I_k\cos(\omega t + \phi_k)}{(x_j - x_k)^2 + (z_k + h)^2}. \quad (13)$$

To obtain the in-phase and quadratic components of $h_n(x_j)$, Equation (11) can be rewritten as:

$$h_n(x_j) = \left[\sum_{k=0}^{M} \frac{z_k I_k \cos(\phi_k)}{(x_j - x_k)^2 + z_k^2}\right] \cdot \cos(\omega t) - \left[\sum_{k=0}^{M} \frac{z_k I_k \sin(\phi_k)}{(x_j - x_k)^2 + z_k^2}\right] \cdot \sin(\omega t) \quad (14)$$
$$= h_n^I(x_j) \cdot \cos(\omega t) + h_n^Q(x_j) \cdot \sin(\omega t)$$

where, $h_n^I(x_j)$ and $h_n^Q(x_j)$ are defined as the in-phase and quadrature components of $h_n(x_j)$, respectively, wherein these values equate to:

$$h_n^I(x_j) = \left[\sum_{k=0}^{M} \frac{z_k I_k \cos(\phi_k)}{(x_j - x_k)^2 + z_k^2}\right] \quad (15)$$

$$h_n^Q(x_j) = \left[\sum_{k=0}^{M} \frac{z_k I_k \sin(\phi_k)}{(x_j - x_k)^2 + z_k^2}\right].$$

Similarly, the vertical and top coils in-phase and quadrature components are found as:

$$h_v^I(x_j) = \left[\sum_{k=0}^{M} \frac{(x_j - x_k)I_k\cos(\phi_k)}{(x_j - x_k)^2 + z_k^2}\right] \quad (16)$$

$$h_v^Q(x_j) = \left[\sum_{k=0}^{M} \frac{(x_j - x_k)I_k\sin(\phi_k)}{(x_j - x_k)^2 + z_k^2}\right];$$

$$h_t^I(x_j) = \left[\sum_{k=0}^{M} \frac{(z_k + h)I_k\cos(\phi_k)}{(x_j - x_k)^2 + (z_k + h)^2}\right] \quad (17)$$

$$h_t^Q(x_j) = \left[\sum_{k=0}^{M} \frac{(z_k + h)I_k\sin(\phi_k)}{(x_j - x_k)^2 + (z_k + h)^2}\right].$$

In general, the EM field 18 generated by primary line 15 is distorted by EM field 18 generated by nearby lines 16 that carry current induced by primary line 15 and/or return current through a ground connection. As shown in the above equations, the measured field is a function of line locations and the electrical currents. To estimate the line location, several field measurements are taken over a cross-section of the line. The measurements, along with the horizontal coordinates at which they are taken, are then matched with Equation (14) to estimate the depth of the line and the horizontal centerline coordinate, along with an estimate of the current in the line, as described in U.S. patent application Ser. No. 11/100,696, "Precise Location of buried metallic pipes and cables in the presence of signal distortion" by Thorkell Gudmundsson, James W. Waite, Johan D. Överby, Stevan Polak, and Niklas Lindstrom, which is assigned to Metrotech Corporation.

The locating problem is formulated to minimize the following cost function:

$$\sum_j \begin{cases} [h_n^I(x_j)_{meas} - h_n^I(x_j)]^2 + [h_n^Q(x_j)_{meas} - h_n^Q(x_j)]^2 + \\ [h_v^I(x_j)_{meas} - h_v^I(x_j)]^2 + [h_v^Q(x_j)_{meas} - h_v^Q(x_j)]^2 + \\ [h_t^I(x_j)_{meas} - h_t^I(x_j)]^2 + [h_t^Q(x_j)_{meas} - h_t^Q(x_j)]^2 \end{cases} \quad (18)$$

where, $h_n^I(x_j)_{meas}$, $h_n^Q(x_j)_{meas}$ are the in-phase and quadrature field from horizontal coil 14 as measured by locator 11; $h_v^I(x_j)_{meas}$, $h_v^Q(x_j)_{meas}$ are the in-phase and quadrature field from vertical coil 19 as measured by locator 11; $h_t^I(x_j)_{meas}$, $h_t^Q(x_j)_{meas}$ are the in-phase and quadrature field from top coil 20 as measured by locator 11.

In the presence of bleedover lines, the phase reference derived from a signal-select modulation scheme can be affected. In signal-select mode, the transmitter signal is composed of a number of whole cycles at a frequency slightly lower than a nominal carrier, followed by the same number of cycles at a frequency slightly higher. And this pattern is repeated indefinitely.

$$\omega_0^- = \omega_0 - \omega_m = (2n-1)\omega_m$$

$$\omega_0^+ = \omega_0 + \omega_m = (2n+1)\omega_m \quad (19)$$

where, $\omega_c$ is the nominal carrier frequency;

$\omega_0$ is the actual carrier frequency;

$\omega_m$ is the modulation frequency;

$\omega_0^+$ and $\omega_0^-$ are the two nearest side tones; and n is the number of whole cycles at each frequency, for a total of 2n cycles in the carrier frequency.

Accordingly, the following relationships occur:

$$\omega_1 = \omega_c(1 + \Delta) \quad (20)$$

$$\omega_1 \cdot T_1 = n \cdot 2\pi$$

$$T_1 = \frac{2n\pi}{\omega_1}$$

$$\omega_2 = \omega_c(1 - \Delta)$$

$$\omega_2 \cdot T_2 = n \cdot 2\pi$$

$$T_2 = \frac{2n\pi}{\omega_2}$$

-continued $$\omega_m = \frac{2\pi}{T_1 + T_2}$$

$$= \frac{2\pi}{\frac{2n\pi}{\omega_1} + \frac{2n\pi}{\omega_2}}$$

$$= \frac{2\pi}{\frac{2n\pi}{\omega_c(1+\Delta)} + \frac{2n\pi}{\omega_c(1-\Delta)}}$$

$$= \frac{\omega_c(1-\Delta^2)}{2n}$$

$$\omega_0 = 2n \cdot \omega_m = \omega_c(1-\Delta^2)$$

where, $\Delta$ is a ratio of offset frequency to nominal carrier frequency.

Further, in some embodiments, the output current can be set to a constant at transmitter 10. For example, in some embodiments FSK modulation is utilized. In FSK modulation, two closely spaced frequencies are alternatively active at a rate defined by the modulation frequency. The transmitted FSK signal could be expressed as follows:

$$I(t) = I_{tx}\sum_{k=0}^{\infty}\binom{\cos\{\omega_1[t+k(T_1+T_2)]\}\cdot}{\{u(t-k(T_1+T_2))-u(t-k(T_1+T)-T_1)\}} + \quad (21)$$

$$I_{tx}\sum_{k=0}^{\infty}\left(\begin{array}{c}\cos\{\omega_2[t+k(T_1+T_2)-T_1]\}\cdot\\ \left\{\begin{array}{c}u(t-k(T_1+T_2)-T_1)-\\ u(t-(k+1)(T_1+T)-T_1)\end{array}\right\}\end{array}\right)$$

$$= a_0 + \sum_{k=1}^{\infty}[a_k\cos(k\cdot\omega_m t) + b_k\sin(k\cdot\omega_m t)]$$

where, u(t) is the standard unit step function, and $a_k$ and $b_k$ are the Fourier series coefficients computed, as shown in Appendix I. In some embodiments, when in signal-select mode, a primary PLL, such as PLL 603 or 604 provided in FIG. 3, can lock the $2n^{th}$ harmonics and use the two side tones harmonics at $(2n-1)\omega_m$ and $(2n+1)\omega_m$, to derive the signal phase information with the nested PLL, such as nested PLL 605 or 606 provided in FIG. 3.

By neglecting the other harmonics outside of $2n^{th}$ harmonics and the two nearest side tones, $\omega^+$ and $\omega_0^-$, Equation (21) can be rewritten as:

$$I(t) = \frac{I_{tx}\cdot\sin(n\pi\Delta)}{n\pi\Delta}\cdot\cos(\omega_0 t + n\pi\Delta) + \quad (22)$$

$$\frac{I_{tx}\cdot 4n\Delta/\pi}{1-(2n\Delta)^2}\cdot\sin\left(\frac{\omega_0^- T_1}{2}\right)\cdot\cos\left(\omega_0^- t - \frac{\omega_0^- T_1}{2}\right) +$$

$$\frac{I_{tx}\cdot 4n\Delta/\pi}{1-(2n\Delta)^2}\cdot\sin\left(\frac{\omega_0^+ T_1}{2}\right)\cdot\cos\left(\omega_0^+ t - \frac{\omega_0^+ T_1}{2}\right)$$

Accordingly, at locator 11, the target line current can be given by:

$$I_0(t) = \frac{I_0\cdot\sin(n\pi\Delta)}{n\pi\Delta}\cdot\cos(\omega_0 t + n\pi\Delta + \phi_0) + \quad (23)$$

$$\frac{I_0^-\cdot 4n\Delta/\pi}{1-(2n\Delta)^2}\cdot\sin\left(\frac{\omega_0^- T_1}{2}\right)\cdot\cos\left(\omega_0^- t - \frac{\omega_0^- T_1}{2} + \phi_0^-\right) +$$

$$\frac{I_0^+\cdot 4n\Delta/\pi}{1-(2n\Delta)^2}\cdot\sin\left(\frac{\omega_0^+ T_1}{2}\right)\cdot\cos\left(\omega_0^+ t - \frac{\omega_0^+ T_1}{2} + \phi_0^+\right)$$

where, $I_0^-$, $I_0$, $I_0^+$ and $\phi_0^-$, $\phi_0$, $\phi_0^+$ are different due to the channel attenuation and phase characteristics at different frequencies.

Similarly, the current in bleedover line 16 could be expressed as:

$$I_k(t) = \frac{I_k\cdot\sin(n\pi\Delta)}{n\pi\Delta}\cdot\cos(\omega_0 t + n\pi\Delta + \phi_k) + \quad (24)$$

$$\frac{I_k^-\cdot 4n\Delta/\pi}{1-(2n\Delta)^2}\cdot\sin\left(\frac{\omega_0^- T_1}{2}\right)\cdot\cos\left(\omega_0^- t - \frac{\omega_0^- T_1}{2} + \phi_k^-\right) +$$

$$\frac{I_k^+\cdot 4n\Delta/\pi}{1-(2n\Delta)^2}\cdot\sin\left(\frac{\omega_0^+ T_1}{2}\right)\cdot\cos\left(\omega_0^+ t - \frac{\omega_0^+ T_1}{2} + \phi_k^+\right), k=1,2,\ldots,M$$

Assuming the EM field sensed by horizontal coil of locator 11 at location (x,z) is:

$$h_n(t) = \frac{\sin(n\pi\Delta)}{n\pi\Delta}\cdot\sum_{k=0}^{M}A_k\cdot\cos(\omega_0 t + n\pi\Delta + \phi_k) + \quad (25)$$

$$\frac{4n\Delta/\pi}{1-(2n\Delta)^2}\cdot\sin\left(\frac{\omega_0^- T_1}{2}\right)\cdot\sum_{k=0}^{M}A_k^-\cdot\cos\left(\omega_0^- t - \frac{\omega_0^- T_1}{2} + \phi_k^-\right) +$$

$$\frac{4n\Delta/\pi}{1-(2n\Delta)^2}\cdot\sin\left(\frac{\omega_0^+ T_1}{2}\right)\cdot\sum_{k=0}^{M}A_k^+\cdot\cos\left(\omega_0^+ t - \frac{\omega_0^+ T_1}{2} + \phi_k^+\right)$$

where, $$A_k = \frac{z_k I_k}{(x-x_k)^2 + z_k^2}, k=0,1,\ldots,M. \quad (26)$$

$$A_k^- = \frac{z_k I_k^-}{(x-x_k)^2 + z_k^2}, k=0,1,\ldots,M \quad (27)$$

$$A_k^+ = \frac{z_k I_k^+}{(x-x_k)^2 + z_k^2}, k=0,1,\ldots,M, \quad (28)$$

then Equation (25) can be rewritten as:

$$h_n(t) = \frac{\sin(n\pi\Delta)}{n\pi\Delta}\cdot A\cdot\cos(\omega_0 t + n\pi\Delta + \varphi_0) + \quad (29)$$

$$\frac{4n\Delta/\pi}{1-(2n\Delta)^2}\cdot\sin\left(\frac{\omega_0^- T_1}{2}\right)\cdot A^-\cdot\cos\left(\omega_0^- t - \frac{\omega_0^- T_1}{2} + \varphi_0^-\right) +$$

$$\frac{4n\Delta/\pi}{1-(2n\Delta)^2}\cdot\sin\left(\frac{\omega_0^+ T_1}{2}\right)\cdot A^+\cdot\cos\left(\omega_0^+ t - \frac{\omega_0^+ T_1}{2} + \varphi_0^-\right)$$

where, $$A = \sqrt{\left[\sum_{k=0}^{M}A_k\cos(\phi_k)\right]^2 + \left[\sum_{k=0}^{M}A_k\sin(\phi_k)\right]^2} = \sqrt{\sum_{j=0}^{M}\sum_{k=0}^{M}A_j A_k\cos(\phi_j - \phi_k)} \quad (30)$$

$$\varphi_0 = \tan^{-1}\left(\frac{\sum_{k=0}^{M}A_k\sin(\phi_k)}{\sum_{k=0}^{M}A_k\cos(\phi_k)}\right) \quad (31)$$

$$A^- = \sqrt{\sum_{j=0}^{M}\sum_{k=0}^{M} A_j^- A_k^- \cos(\phi_j^- - \phi_k^-)} \quad (32)$$

$$\varphi_0^- = \tan^{-1}\left(\frac{\sum_{k=0}^{M} A_k^- \sin(\phi_k^-)}{\sum_{k=0}^{M} A_k^- \cos(\phi_k^-)}\right) \quad (33)$$

$$A^+ = \sqrt{\sum_{j=0}^{M}\sum_{k=0}^{M} A_j^+ A_k^+ \cos(\phi_j^+ - \phi_k^+)} \quad (34)$$

$$\varphi_0^+ = \tan^{-1}\left(\frac{\sum_{k=0}^{M} A_k^+ \sin(\phi_k^+)}{\sum_{k=0}^{M} A_k^+ \cos(\phi_k^+)}\right). \quad (35)$$

From Equations (20) and (29) above, the carrier frequency is $\omega_0 = 2n\omega_m$, and the phase is $\omega_0 t + n\pi\Delta = \phi_0$. The demodulated FM signal provided to a signal direction detector of DPLL 603/604 of FIG. 3, which is further described in the '376 application, would then be:

$$h_n(t)\cdot[-\sin(\omega_0 t + \phi_0 = n\pi\Delta)]. \quad (36)$$

After a band-pass filter, which is centered at $\omega_m$ and which is further described in the '376 application, the FM signal input to Phase DPLL block 605/606 of FIG. 3 would be (see Appendix II for further detail):

$$\frac{-2n\Delta/\pi}{1-(2n\Delta)^2}\cdot\sin\left(\frac{\omega_0^- T_1}{2}\right)\cdot A^-\cdot\sin\left(\omega_m t + \frac{\omega_0^- T_1}{2} + n\pi\Delta + \varphi_0 - \varphi_0^-\right) + \quad (37)$$

$$\frac{-2n\Delta/\pi}{1-(2n\Delta)^2}\cdot\sin\left(\frac{\omega_0^+ T_1}{2}\right)\cdot A^+\cdot$$

$$\sin\left(-\omega_m t + \frac{\omega_0^+ T_1}{2} + n\pi\Delta + \varphi_0 - \varphi_0^+\right) =$$

$$\frac{n\Delta/\pi}{1-(2n\Delta)^2}\cdot A^-\cdot[\cos(\omega_m t + \omega_0^- T_1 + n\pi\Delta + \varphi_0 - \varphi_0^-) - $$

$$\cos(\omega_m t + n\pi\Delta + \varphi_0 - \varphi_0^-)] + $$

$$\frac{n\Delta/\pi}{1-(2n\Delta)^2}\cdot A^+\cdot[\cos(-\omega_m t + \omega_0^+ T_1 + n\pi\Delta + \varphi_0 - \varphi_0^+) -$$

$$\cos(-\omega_m t + n\pi\Delta + \varphi_0 - \varphi_0^+)] = \frac{n\Delta/\pi}{1-(2n\Delta)^2}\cdot\frac{A^-\cdot A^+}{2}\cdot$$

$$\left\{\begin{array}{l}(1+\delta)\cdot\left[\begin{array}{c}\cos(\omega_m t + \omega_0^- T_1 + n\pi\Delta + \varphi_0 - \varphi_0^-) - \\ \cos(\omega_m t + n\pi\Delta + \varphi_0 - \varphi_0^-)\end{array}\right] \\ +(1+\delta)\cdot\left[\begin{array}{c}\cos(-\omega_m t + \omega_0^+ T_1 + n\pi\Delta + \varphi_0 - \varphi_0^+) - \\ \cos(-\omega_m t + n\pi\Delta + \varphi_0 - \varphi_0^+)\end{array}\right]\end{array}\right\} \approx$$

$$-4\cos\left(\varphi_0 - \frac{\varphi_0^- + \varphi_0^+}{2}\right)\cdot\cos(\Delta n\pi)\cdot\cos\left(\frac{\Delta\pi}{2}\right)\cdot$$

$$\cos\left(\omega_m t + \frac{\Delta\pi}{2} - \frac{\varphi_0^- - \varphi_0^+}{2} + \delta\varphi\right)$$

where, $$\delta = (A^- - A^+)/(A^- + A^+).$$

$$\delta\varphi = \tan^{-1}\left(\tan\left(\varphi_0 - \frac{\varphi_0^- + \varphi_0^+}{2}\right)\cdot\frac{\sin(\Delta n\pi)\cdot\sin\left(\frac{\Delta\pi}{2}\right) + \delta\cdot\cos(\Delta n\pi)\cdot\cos\left(\frac{\Delta\pi}{2}\right)}{\cos(\Delta n\pi)\cdot\cos\left(\frac{\Delta\pi}{2}\right) + \delta\cdot\sin(\Delta n\pi)\cdot\sin\left(\frac{\Delta\pi}{2}\right)}\right) \approx$$

$$\left(\tan\left(\varphi_0 - \frac{\varphi_0^- + \varphi_0^+}{2}\right)\cdot\left[\delta + \tan\left(\frac{\Delta\pi}{2}\right)\cdot\tan(\Delta n\pi)\right]\right) \approx$$

$$\left[\delta + \tan\left(\frac{\Delta\pi}{2}\right)\cdot\tan(\Delta n\pi)\right]\cdot\left(\varphi_0 - \frac{\varphi_0^- + \varphi_0^+}{2}\right)$$

Normally, $$\Delta = 1, \frac{\varphi_0^- + \varphi_0^+}{2} \approx \varphi_0, \delta = \frac{A^- - A^+}{A^- + A^+} \approx 0,$$

and $\delta\phi \approx 0$. Therefore, the FM carrier phase is approximately $$\omega_m t + \frac{\pi\Delta}{2} + \frac{\varphi_0^+ - \varphi_0^-}{2}, \text{ with } \frac{\varphi_0^+ - \varphi_0^-}{2}$$

being the error term. The re-modulated signal phase is determined by multiplying the FM carrier phase by the modulation rate, $2n$, i.e., $$2n\cdot\left(\omega_m t + \frac{\pi\Delta}{2} + \frac{\varphi_0^+ - \varphi_0^-}{2}\right) = \omega_0 t + n\pi\Delta + n\cdot(\varphi_0^+ - \varphi_0^-) \quad (38)$$

with the phase reference error being $$\Delta\phi = n\cdot(\phi_0^+ - \phi_0^-). \quad (39)$$

The following equations provide a phase error of the horizontal coil signal, as illustrated below by assuming that:

$$\phi_k^+ = \phi_k^- + \delta\phi_k$$
$$A_k^+ = A_k^- + \delta A_k$$

$$\frac{\partial \varphi_0^-}{\partial \phi_j} = \frac{\sum_{k=0}^{M} A_j^- A_k^- \cos(\phi_j^- - \phi_k^-)}{\sum_{j=0}^{M}\sum_{k=0}^{M} A_j^- A_k^- \cos(\phi_j^- - \phi_k^-)} \approx \frac{\sum_{k=0}^{M} A_j A_k \cos(\phi_j - \phi_k)}{\sum_{j=0}^{M}\sum_{k=0}^{M} A_j A_k \cos(\phi_j - \phi_k)}$$

$$\frac{\partial \varphi_0^-}{\partial A_j} = \frac{\sum_{k=0}^{M} A_k^- \sin(\phi_j^- - \phi_k^-)}{\sum_{j=0}^{M}\sum_{k=0}^{M} A_j^- A_k^- \cos(\phi_j^- - \phi_k^-)} \approx \frac{\sum_{k=0}^{M} A_k \sin(\phi_j - \phi_k)}{\sum_{j=0}^{M}\sum_{k=0}^{M} A_j A_k \cos(\phi_j - \phi_k)}$$

$$\varphi_0^+ - \varphi_0^- \approx \sum_{j=0}^{M} \frac{\partial \varphi_0^-}{\partial \phi_j} \cdot \delta\phi_j + \sum_{j=0}^{M} \frac{\partial \varphi_0^-}{\partial A_j} \cdot \delta A_j$$

$$= \frac{\sum_{j=0}^{M}\sum_{k=0}^{M} A_j A_k \cos(\phi_j - \phi_k) \cdot \delta\phi_j}{\sum_{j=0}^{M}\sum_{k=0}^{M} A_j A_k \cos(\phi_j - \phi_k)} +$$

$$\frac{\sum_{j=0}^{M}\sum_{k=0}^{M} A_k \sin(\phi_j - \phi_k) \cdot \delta A_j}{\sum_{j=0}^{M}\sum_{k=0}^{M} A_j A_k \cos(\phi_j - \phi_k)}$$

$$= \frac{\sum_{j=0}^{M}\sum_{k=0}^{M} A_j A_k \cos(\phi_j - \phi_k) \cdot \delta\phi_j + \sum_{j=0}^{M}\sum_{k=0}^{M} A_k \sin(\phi_j - \phi_k) \cdot \delta A_j}{\sum_{j=0}^{M}\sum_{k=0}^{M} A_j A_k \cos(\phi_j - \phi_k)}$$

with $$\delta A_j = \frac{z_j \cdot \delta I_j}{(x - x_j)^2 + z_j^2}$$
$$= \frac{z_j \cdot (I_j^+ - I_j^-)}{(x - x_j)^2 + z_j^2}$$
$$\approx \frac{z_j \cdot I_j}{(x - x_j)^2 + z_j^2} \cdot \frac{(I_j^+ - I_j^-)}{I_j}$$
$$= A_j \cdot \frac{\delta I_j}{I_j}.$$

Similarly the phrase error of the vertical coil signal is $$\varphi_{v0}^+ - \varphi_{v0}^- \approx \frac{\sum_{j=0}^{M}\sum_{k=0}^{M} B_j B_k \cos(\phi_j - \phi_k) \cdot \delta\phi_j + \sum_{j=0}^{M}\sum_{k=0}^{M} B_k \cos(\phi_j - \phi_k) \cdot \delta B_j}{\sum_{j=0}^{M}\sum_{k=0}^{M} B_j B_k \cos(\phi_j - \phi_k)}. \quad (40)$$

where, $$\delta B_j \approx B_j \cdot \frac{\delta I_j}{I_j}.$$

By considering $\Delta\phi \neq 0$, some embodiments of the present invention can derive the in-phase and quadrature components of the electromagnetic field from Equation (25) with phase $\omega_0 t + n\pi\Delta + \Delta\phi$, leading to more accurate measurements of $h_n^Q(x_j)$ and $h_n^Q(x_j)$, which allows for more accurate locating. The values of $h_n^I(x_j)$ and $h_n^Q(x_j)$ are shown as follows:

$$a_{2n} \cdot \cos(\omega_0 t) + b_{2n} \cdot \sin(\omega_0 t) \approx \quad (41)$$

$$\frac{\sin(n\pi\Delta)}{n\pi\Delta} \left\{ \begin{bmatrix} h_n^I(x_j) \cdot \cos(\Delta\phi) + \\ h_n^Q(x_j) \cdot \sin(\Delta\phi) \end{bmatrix} \cos(\omega_0 t + n\pi\Delta + \Delta\phi) \\ - \begin{bmatrix} h_n^Q(x_j) \cdot \cos(\Delta\phi) - \\ h_n^I(x_j) \cdot \sin(\Delta\phi) \end{bmatrix} \cdot \sin(\omega_0 t + n\pi\Delta + \Delta\phi) \right\} =$$

$$\frac{\sin(n\pi\Delta)}{n\pi\Delta} \left\{ h_n^I(x_j)_{mod} \cdot \cos(\omega_0 t + n\pi\Delta + \Delta\phi) - h_n^Q(x_j)_{mod} \cdot \sin(\omega_0 t + n\pi\Delta + \Delta\phi) \right\}$$

where, $h_n^I(x_j)_{mod}$ and $h_n^Q(x_j)_{mod}$ are defined as:

$$h_n^I(x_j)_{mod} = \frac{\sin(n\pi\Delta)}{n\pi\Delta} \cdot [h_n^I(x_j) \cdot \cos(\Delta\phi) + h_n^Q(x_j) \cdot \sin(\Delta\phi)] \quad (42)$$
$$h_n^Q(x_j)_{mod} = \frac{\sin(n\pi\Delta)}{n\pi\Delta} \cdot [h_n^Q(x_j) \cdot \cos(\Delta\phi) - h_n^I(x_j) \cdot \sin(\Delta\phi)]$$

or, $$\begin{bmatrix} h_n^I(x_j)_{mod} \\ h_n^Q(x_j)_{mod} \end{bmatrix} = \quad (43)$$

$$\frac{\sin(n\pi\Delta)}{n\pi\Delta} \cdot \begin{pmatrix} \cos(\Delta\phi_v) & \sin(\Delta\phi_v) \\ -\sin(\Delta\phi_v) & \cos(\Delta\phi_v) \end{pmatrix} \cdot \begin{bmatrix} h_n^I(x_j) \\ h_n^Q(x_j) \end{bmatrix}$$

$$\begin{bmatrix} h_n^I(x_j) \\ h_n^Q(x_j) \end{bmatrix} = \frac{\sin(n\pi\Delta)}{n\pi\Delta} \cdot \begin{pmatrix} \cos(\Delta\phi) & -\sin(\Delta\phi) \\ \sin(\Delta\phi) & \cos(\Delta\phi) \end{pmatrix} \cdot \begin{bmatrix} h_n^I(x_j)_{mod} \\ h_n^Q(x_j)_{mod} \end{bmatrix}.$$

For the vertical coil, the quadrature and in-phase fields are given by:

$$\begin{bmatrix} h_v^I(x_j)_{mod} \\ h_v^Q(x_j)_{mod} \end{bmatrix} = \frac{\sin(n\pi\Delta)}{n\pi\Delta} \cdot \begin{pmatrix} \cos(\Delta\phi) & \sin(\Delta\phi) \\ -\sin(\Delta\phi) & \cos(\Delta\phi) \end{pmatrix} \cdot \begin{bmatrix} h_v^I(x_j) \\ h_v^Q(x_j) \end{bmatrix} \quad (44)$$

$$\begin{bmatrix} h_v^I(x_j) \\ h_v^Q(x_j) \end{bmatrix} = \frac{\sin(n\pi\Delta)}{n\pi\Delta} \cdot \begin{pmatrix} \cos(\Delta\phi) & -\sin(\Delta\phi) \\ \sin(\Delta\phi) & \cos(\Delta\phi) \end{pmatrix} \cdot \begin{bmatrix} h_v^I(x_j)_{mod} \\ h_v^Q(x_j)_{mod} \end{bmatrix}.$$

And for the top coil, the quadrature and in-phase fields are given by:

$$\begin{bmatrix} h_t^I(x_j)_{mod} \\ h_t^Q(x_j)_{mod} \end{bmatrix} = \frac{\sin(n\pi\Delta)}{n\pi\Delta} \cdot \begin{pmatrix} \cos(\Delta\phi) & \sin(\Delta\phi) \\ -\sin(\Delta\phi) & \cos(\Delta\phi) \end{pmatrix} \cdot \begin{bmatrix} h_t^I(x_j) \\ h_t^Q(x_j) \end{bmatrix} \quad (45)$$

$$\begin{bmatrix} h_t^I(x_j) \\ h_t^Q(x_j) \end{bmatrix} = \frac{\sin(n\pi\Delta)}{n\pi\Delta} \cdot \begin{pmatrix} \cos(\Delta\phi) & -\sin(\Delta\phi) \\ \sin(\Delta\phi) & \cos(\Delta\phi) \end{pmatrix} \cdot \begin{bmatrix} h_t^I(x_j)_{mod} \\ h_t^Q(x_j)_{mod} \end{bmatrix}.$$

So the optimization algorithm for determining position can be formulated to minimize the following cost function:

$$\sum_j \left\{ \begin{array}{l} [h_n^I(x_j)_{meas} - h_n^I(x_j)_{mod}]^2 + [h_n^Q(x_j)_{meas} - h_n^Q(x_j)_{mod}]^2 + \\ [h_v^I(x_j)_{meas} - h_v^I(x_j)_{mod}]^2 + [h_v^Q(x_j)_{meas} - h_v^Q(x_j)_{mod}]^2 + \\ [h_t^I(x_j)_{meas} - h_t^I(x_j)_{mod}]^2 + [h_t^Q(x_j)_{meas} - h_t^Q(x_j)_{mod}]^2 \end{array} \right\} \quad (46)$$

where, $h_n^I(x_j)_{meas}$, $h_n^Q(x_j)_{meas}$ are the measured in-phase and quadrature field from horizontal coil 14; $h_v^I(x_j)_{meas}$, $h_v^Q(x_j)_{meas}$ are the measured in-phase and quadrature field from vertical coil 19; $h_t^I(x_j)_{meas}$, $h_t^Q(x_j)_{meas}$ are the measured in-phase and quadrature field from top coil 20. And $h_n^I(x_j)_{mod}$, $h_n^Q(x_j)_{mod}$, $h_v^I(x_j)_{mod}$, $h_v^Q(x_j)_{mod}$, $h_t^I(x_j)_{mod}$, $h_t^Q(x_j)_{mod}$ are functions of the $k^{th}$ line location $(x_k, z_k)$, current $I_k$, phase $\phi_k$, and the current amplitude variation $\epsilon_k$, k=0, 1, . . . , M. In other words, the optimization algorithm compares the measured fields to the modulated fields to determine the value of the cost function so that, as provided below, locator 11 can determine a confidence level for the accuracy when locating the concealed line.

In general, the phase reference derived from the phase DPLL blocks 605 and 606 of FIG. 3 in the current signal select architecture would likely be biased due to the presence of bleedover lines. The phase measurement error term can be modeled as a function of locations, current and phase of each line, plus a current amplitude and phase variation term, namely $\delta A_j$ and $\delta \phi_j$, wherein the phase measurement error term can be calculated according to the following:

$$\Delta \phi = n \cdot \frac{\sum_{j=0}^{M} \sum_{k=0}^{M} A_j A_k \cos(\phi_j - \phi_k) \cdot \delta \phi_j + \sum_{j=0}^{M} \sum_{k=0}^{M} A_k \sin(\phi_j - \phi_k) \cdot \delta A_j}{\sum_{j=0}^{M} \sum_{k=0}^{M} A_j A_k \cos(\phi_j - \phi_k)} \quad (47)$$

$$\Delta \phi_v \approx n \cdot \frac{\sum_{j=0}^{M} \sum_{k=0}^{M} B_j B_k \cos(\phi_j - \phi_k) \cdot \delta \phi_j + \sum_{j=0}^{M} \sum_{k=0}^{M} B_k \sin(\phi_j - \phi_k) \cdot \delta B_j}{\sum_{j=0}^{M} \sum_{k=0}^{M} B_j B_k \cos(\phi_j - \phi_k)}. \quad (48)$$

By calculating the phase measurement errors as a function of the parameters of all of the hypothetic lines, locator 11 can determine an estimation of the confidence levels. Therefore, the walkover algorithm can be formulated as minimizing the following cost function.

$$\sum_j \left\{ \begin{array}{l} [h_n^I(x_j)_{meas} - h_n^I(x_j)_{mod}]^2 + [h_n^Q(x_j)_{meas} - h_n^Q(x_j)_{mod}]^2 + \\ [h_v^I(x_j)_{meas} - h_v^I(x_j)_{mod}]^2 + [h_v^Q(x_j)_{meas} - h_v^Q(x_j)_{mod}]^2 + \\ [h_t^I(x_j)_{meas} - h_t^I(x_j)_{mod}]^2 + [h_t^Q(x_j)_{meas} - h_t^Q(x_j)_{mod}]^2 \end{array} \right\} \quad (49)$$

Figure 4A:
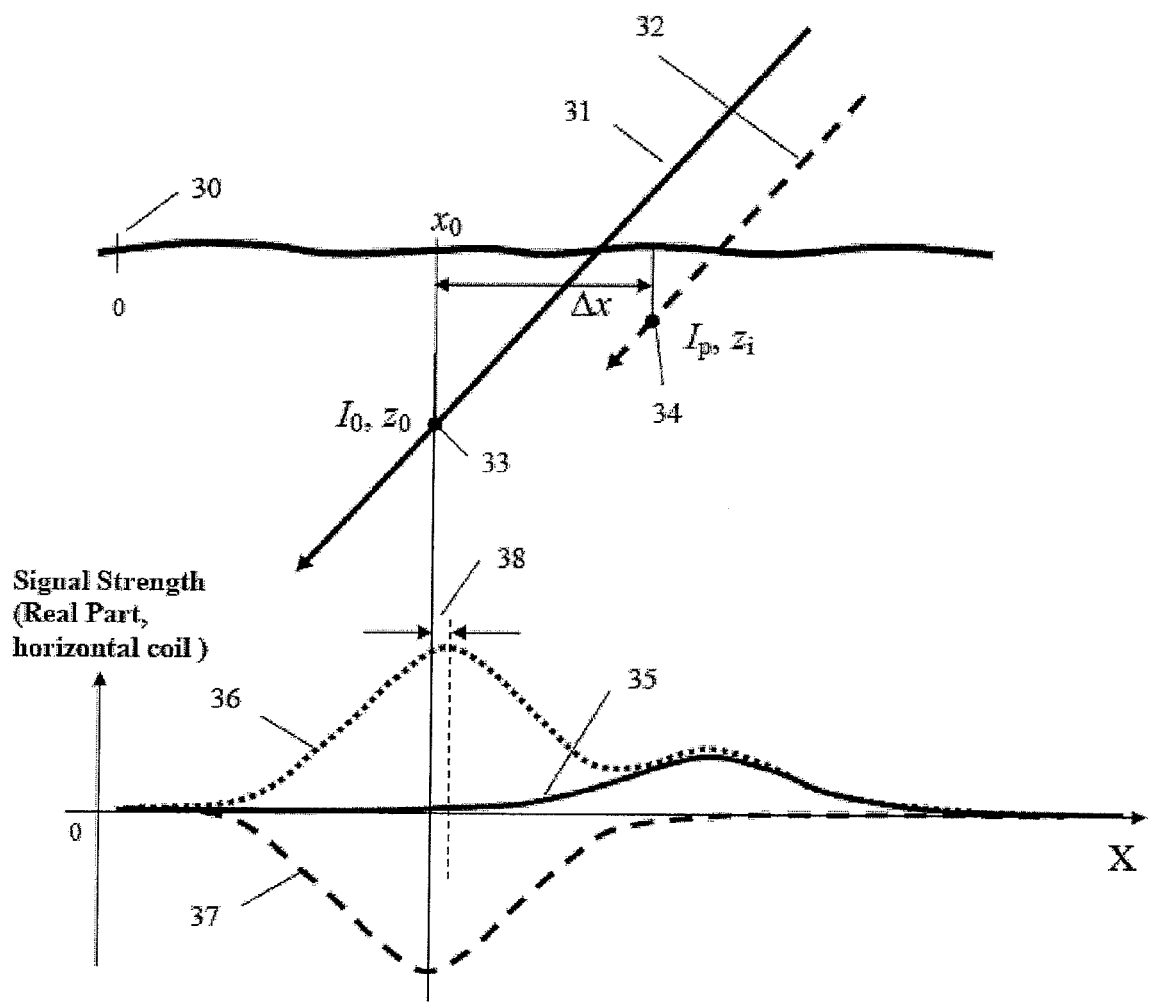
FIGS. 4A & 4B are diagrammatic representations of a walkover locate process where the induced electromagnetic field on a target conductor is distorted by a field on a bleedover conductor.
Figure 4B:
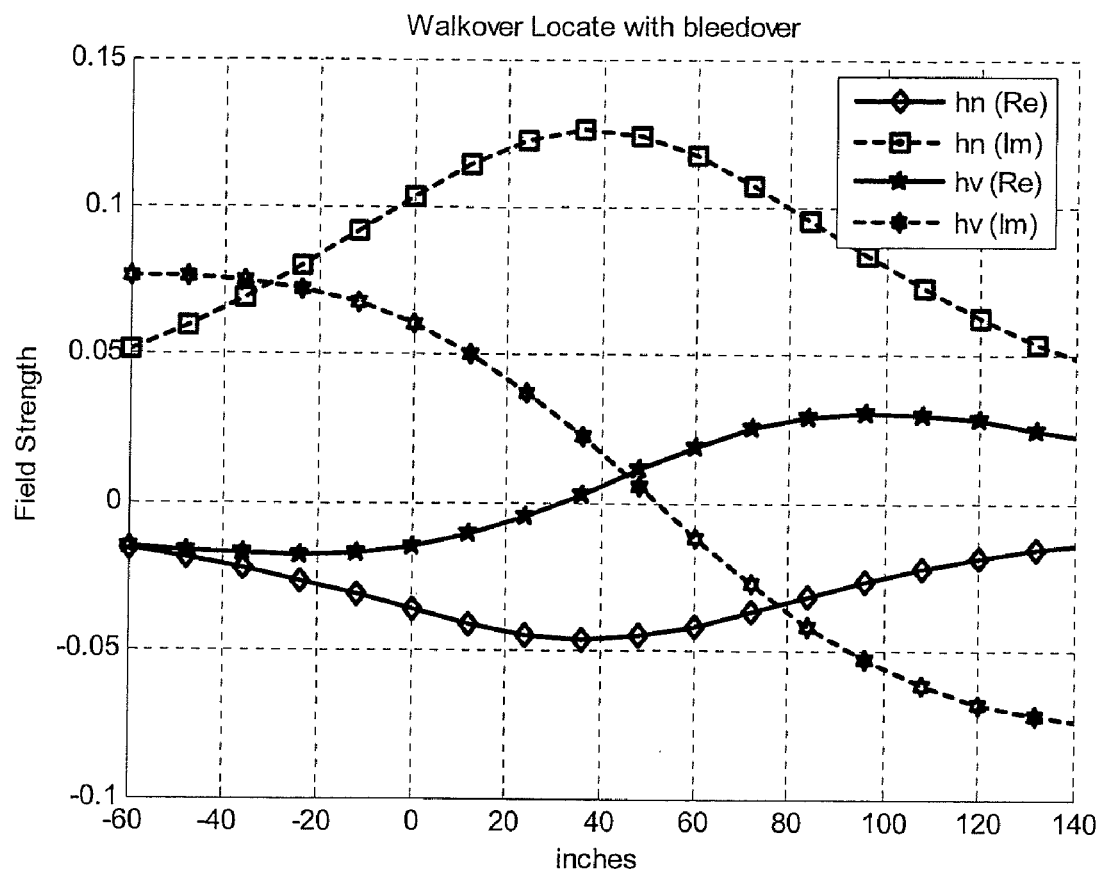

FIG. 4A illustrates an exemplary geometry of a walkover locate. Unknown parameters $(x_0, z_0,$ and $I_0)$ at point 33 can be estimated, with the parameters $(x_j, h_n)$ as the measurement set (with the measured parameter $h_n$, being complex). The walkover procedure starts at arbitrary reference position 30 and proceeds, for example, along the path indicated, across the region that has significant detectable signal strength, which can encompass the target line 31 and all bleedover lines. One of the bleedover lines is represented by line 32 in FIG. 4A. FIG. 4B shows the real part of the aggregate electromagnetic field strength as a function of walkover distance (i.e., the distance from target line 33). Curve 36 is the measured magnitude of the electromagnetic field strength, which is a summation of the real parts of the electromagnetic field strength 37 (illustrated in its negative position to distinguish from curve 36) originating from main line 31 and field strength 35 originating from bleedover line 32. Only the signal represented by curve 36 is measurable; signals 37 and 35 are indirectly obtained via the optimization.

Some embodiments of the invention use a forward facing electromagnetic field sensor, as in coil 24 of FIG. 2, to form a third dimension of field measurements. Although long-haul lines are generally deployed in rights-of-way that have clear line directions, there can be curvatures and road crossings, for which a front-facing coil is an appropriate method to detect if the operator is walking in a transverse (right angle) direction to the line, rather than at a more oblique angle. The data from coil 24 is generally not used in the optimization, but some embodiments of the invention may extend the field model represented by Equation (11) to allow off-axis oblique walkovers.

Some embodiments of the optimization procedures performed in model optimization 23 (FIG. 2) tend to be more sensitive to both measurement errors and initial conditions as the number of EM field sources increases, but optimization can be performed with numerous lines. Buried underground cable vault systems tend to hold many lines; in some cases up to 60 lines may be allocated within a 2 square meter duct. However, due to the importance of physical proximity, bleedover coupling tends to occur in a relatively small subset of lines within the duct. Typically, in addition to the target line, usually only one or two lines in a large duct are found to be carrying significant bleedover current (e.g., more than 10% of the current in the primary target line). Thus, a numerical optimization approach, through gradient progression, solves for the set of unknown line positions, phases, and currents, compatible with the problem of line location within a duct.

One complication in the optimization procedure performed in model optimization 23 for solving the vectoring problem is additional field distortion caused by non-zero conduction ($\sigma$) of the soil. In the simple case, where only a single line is present and the soil conductivity is uniform around the line, correction for conductivity does not significantly affect the outcome (at worst, the depth is underestimated a bit). However, when multiple lines contribute to the measured electromagnetic field or when the soil conductivity is not uniform, an optimization can have some problems. Nonzero conductivity causes the field originating from target line 15 to have a "ghost" quadrature component, and non-uniformity of the conductivity can cause some spatial distortion in the field from each line. Although these distortions can introduce a bias into the vectoring estimate, the measured signal from target line 15 can be allowed in some embodiments of the model to have a quadrature component (non-zero phase) in the optimization, minimizing this potential source of error by allowing a phase rotation to offset the quadrature component that might be present due to this situation.

Estimation of Confidence Intervals

The Levenberg-Marquardt optimization problem, described below, treats each source (target line 15 and numerous, for example three, strong bleedover lines) as having unknown depth, centerline, and current. The soil conductivity $\sigma$ can be assumed fixed and equal to zero, although in some embodiments conductivity can also be part of the variable set included in the optimization. Using the notation above, the optimization variables are $z_p$, $x_p$, and $I_p^i + jI_p^q$, where p ranges from 0 to N, and index 0 refers to target line 15. The superscripts i and q denote the in-phase and quadrature components of the current, respectively, such that the phase of the current in that line is equal to $$\tan^{-1}\left(\frac{I_p^q}{I_p^i}\right).$$

In addition, the angle parameter $\theta$ models the phase transfer function on target line 15 that affects all measurements uniformly, such that the observed phase on each line (with respect to the reference phase imparted at the transmitter) is $$\tan^{-1}\left(\frac{I_p^q}{I_p^i}\right) + \theta.$$

This constant phase rotation of the complex plane accounts for the unknown phase delay along target line 15 from transmitter 10 to the measurement position.

A constraint is placed on every iteration of the Levenberg-Marquardt optimization algorithm. Once per iteration the optimization method results in new current, depth, and centerline estimates, as described below, for target line 15 and all bleedover lines 16. The predicted currents are forced to adhere to the equation $$\sum_{p=1}^{k} \sqrt{I_p^{i2} + jI_p^{q2}} \le \sqrt{I_0^{i2} + jI_0^{q2}} \qquad (50)$$

such that the absolute value of the sum of bleedover and return currents cannot be greater than the outgoing current in the targeted line. In all practical cases the magnitude sum on the left side of this inequality is not close to the magnitude of the target line current, since the walkover field measurements see only distinct conductors, and not the current that is returning through earth ground.

Because there is no a priori information regarding how many bleedover lines 16 carry significant current (that would distort the field emanating from target line 15), a hypothesis test procedure is used to determine the most likely scenario. To accomplish a target line locate, several (for example four) scenarios are run using the Levenberg-Marquardt optimization method. A first scenario uses a model of the field in which there are no bleedover sources 16 present. Other scenarios add the effects of increasing numbers of bleedover lines 16. In total there are 5, 9, 13, 17, etc. (corresponding to 1, 2, 3, 4, etc. bleedover lines 16, respectively) unknowns for the modeled scenarios, respectively. The optimization of model optimization 23 can provide a result as long as the number of measurements $(x_n, h_n)$ is equal to or greater then the number of unknowns. To test which of the hypothetical bleedover scenarios best represents the data, a cost function can be formed using the mean square error of the predicted field (after optimization) compared to the measured data. This is used as a quality metric for that bleedover model. Appropriate choice of a minimum acceptable fit criterion (using the cost function) is an effective way to eliminate walkover locates which are dominated by noise and interference, and thus might result in "false positive" centerline and depth prediction errors.

The hypothesis test procedure can also be sensitive to overdetermination of the model, when more bleedover sources 16 are modeled than actually exist in a particular scenario. Although these extra bleedover lines 16 increase the freedom that the optimization has to achieve a good fit, they can also result in a potential centerline prediction bias of target line 15. Penalties are levied on the cost function as the number of bleedover lines 16 increases, so that the least complex solution that still achieves a targeted model performance is chosen by the hypothesis test procedure.

At the end of the optimization process, and subsequent hypothesis test, the chosen result includes predictions of centerline, depth, current, phase, and error for target line 15 and each of the bleedover lines 16. Only the parameters associated with target line 15 are of interest, and the accuracy of these predictions must be stated with confidence bounds. A confidence bound (or interval) for these model parameters is developed below.

The parameter set for the optimization cost function is defined as:

$$a = [x_0, z_0, I_0, \phi_0, dI_0, d\phi_0, x_1, z_1, I_1, \phi_1, dI_1, d\phi_1, \ldots, x_M, z_M, I_M, \phi_M, dI_M, d\phi_M]$$

The optimization cost function that is minimized to estimate the model parameters is the sum-of-squares of the model output errors, $$S(a) = \sum_{j=1}^{N} \|y_j - y(x_j; a)\|^2 \qquad (51)$$

$$= \sum_{j} \left\{ \begin{array}{l} \left[\dfrac{h_n^I(x_j)_{meas} -}{h_n^I(x_j)_{mod}}\right]^2 + \left[\dfrac{h_n^Q(x_j)_{meas} -}{h_n^Q(x_j)_{mod}}\right]^2 + \\ \left[\dfrac{h_v^I(x_j)_{meas} -}{h_v^I(x_j)_{mod}}\right]^2 + \left[\dfrac{h_v^Q(x_j)_{meas} -}{h_v^Q(x_j)_{mod}}\right]^2 + \\ \left[\dfrac{h_v^I(x_j)_{meas} -}{h_n^I(x_j)_{mod}}\right]^2 + \left[\dfrac{h_n^Q(x_j)_{meas} -}{h_v^Q(x_j)_{mod}}\right]^2 \end{array} \right\}$$

where $y_r$, $h_n$, etc. are the measurements.

Associated with the model is the curvature matrix, composed of the second derivatives of the cost function with respect to the model parameters, $$\alpha = \left[\frac{1}{2}\frac{\partial^2 S(a)}{\partial a_k \partial a_l}\right] \approx \left[\frac{\partial S(a)}{\partial a_k} \cdot \frac{\partial S(a)}{\partial a_l}\right] \qquad (52)$$

often approximated with only the first derivatives of the model as $$\alpha_{kl} = \sum_{j=1}^{N} \left( \begin{array}{l} \dfrac{\partial h_n^I(x_j)_{mod}}{\partial a_k} \cdot \dfrac{\partial h_n^I(x_j)_{mod}}{\partial a_l} + \dfrac{\partial h_n^Q(x_j)_{mod}}{\partial a_k} \cdot \\ \dfrac{\partial h_n^Q(x_j)_{mod}}{\partial a_l} + \dfrac{\partial h_v^I(x_j)_{mod}}{\partial a_k} \cdot \dfrac{\partial h_v^I(x_j)_{mod}}{\partial a_l} + \\ \dfrac{\partial h_v^Q(x_j)_{mod}}{\partial a_k} \cdot \dfrac{\partial h_v^Q(x_j)_{mod}}{\partial a_l} + \dfrac{\partial h_t^I(x_j)_{mod}}{\partial a_k} \cdot \\ \dfrac{\partial h_t^I(x_j)_{mod}}{\partial a_l} + \dfrac{\partial h_t^Q(x_j)_{mod}}{\partial a_k} \cdot \dfrac{\partial h_t^Q(x_j)_{mod}}{\partial a_l} \end{array} \right) \qquad (53)$$

The covariance matrix of the model parameters at the optimum is important for estimating a confidence interval. This matrix is the inverse of the curvature matrix, $$C = \alpha^{-1} \qquad (54)$$

The primary parameters estimated by the optimization are the centerline and depth of target line 15, and the estimated values of those parameters can be annotated by a confidence interval.

Under the following assumptions, the confidence interval of each individual model parameter can be estimated based on sum of squares function S(a). Sum of squares function S(a) is a function of the parameter elements of a only. The data provide the numerical coefficients in S(a). In the parameter space, the function S(a) can be represented by the contours of a surface. If the model were linear in a, the surface contours would be ellipsoidal and would have a single global minimum, S(â), at the location defined by the least square estimator â. If the model is nonlinear, the contours are not ellipsoidal but tend to be irregular perhaps with several local minimal points. An exact confidence contour is defined by taking S(a)=constant, which, in this high-dimension nonlinear example, is not feasible. Under the assumption that the linearized form of the model is valid around â, the final estimate of a, the ellipsoidal confidence region is obtained by the following formula:

$$(a-\hat{a}) \cdot (\alpha)_{a=\hat{a}} \cdot (a-\hat{a}) \leq p \cdot s^2 \cdot F(p, n-p, 1-\alpha)$$

$$s^2 = S(\hat{a})/(n-p) \quad (55)$$

where, p is the total number of parameters; n is the total number of measurements; and $100(1-\alpha)\%$ is the confidence level (for instance, $\alpha=0.05$ represents 95% confidence); F(p, n-p, 1-$\alpha$-$\alpha$) is the F-distribution function.

The embodiments described above can be used to precisely locate a target line in areas where bleedover can cause large errors in positioning. Although some extra time is associated with setting up the walkover (the transect should be associated with a reference point away from the centerline (point 30 in FIG. 4A)), the benefit in positioning accuracy is large. However, when bleedover is minimal, it is not always necessary to perform the walkover locate using optimization methods to determine the target line position. In fact, traditional peak and null centerline detection methods can be just as precise in some scenarios. Thus there is a benefit in having a "bleedover detection" method built in to the locate receiver in order to assist the user in determining when a walkover locate should be performed.

Figure 5A:
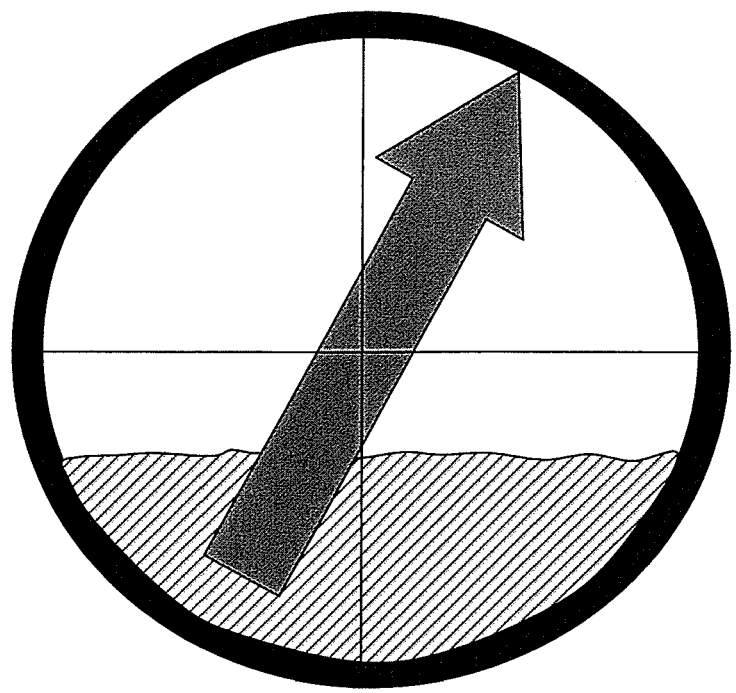
FIGS. 5A & 5B illustrate a component of a display for a line locator consistent with the present invention.
Figure 5B:
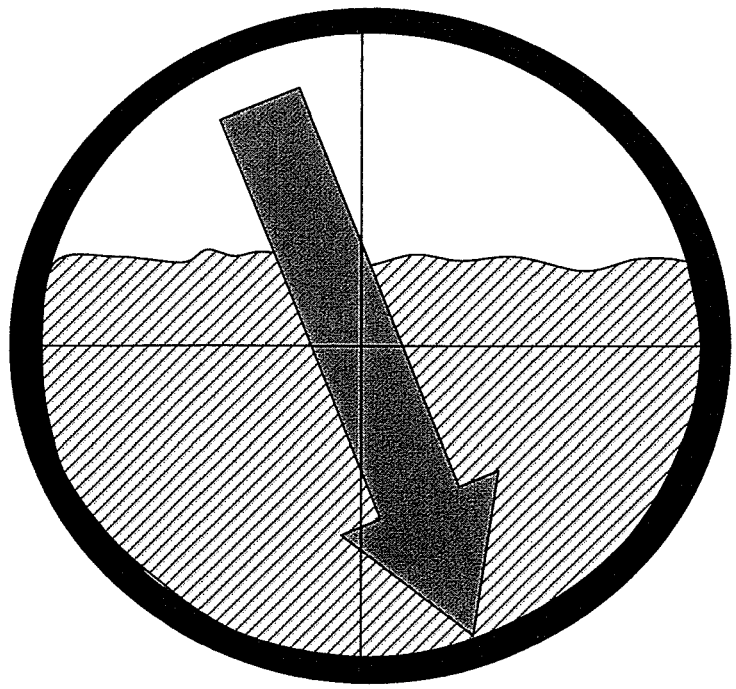

FIGS. 5A & 5B illustrate a component of graphical display that is presented on the locator display 12, in the standard line locate modes. Pointer 71 shows the user the detected line and signal direction. The amount of deflection of the pointer (off of vertical line 72) is based on the measured signal strength of the forward facing coil 24 compared to the signal strength of the horizontal coil 14. In effect, this gives a qualitative measure of whether the tracked line has an impending curvature. If the locate receiver is facing directly forward, and the line extends straight ahead, then Pointer 71 is directed straight upward (toward the upper half plane of the circle).

Pointer 71 is also used to denote the direction of the signal in the cable or pipe, as discussed in the '376 application. When the aggregate signal phase is positive, the pointer movement is in the upper half plane, else it is in the lower half plane, as in pointer 74 of FIG. 5B. The aggregate signal phase can be taken from the horizontal coil quantity $$\tan^{-1}\left(\frac{\text{Im}[h_n]_{hp11}}{\text{Re}[h_n]_{hp11}}\right),$$

or the equivalent from the vertical coil (whichever has greater signal magnitude).

The shaded backgrounds 73 and 76 of FIGS. 5A & 5B represents the level of bleedover in the measured signal. The aggregate signal phase is used to determine the level of bleedover, which is a qualitative indication of the degree of distortion in the electromagnetic field. When the phase is zero, the level of the shaded background is zero (there is no shading). When the phase is 90°, indicating that the signals from bleedover lines predominate the measurement, the background is completely shaded. The update rate of the bleedover detection icon is on the order of 30 Hz, or more quickly than the field changes while an operator is walking down the line during a locate. Thus, the user is effectively warned about bleedover situations and can take explicit action to invoke the walkover locate precise positioning mode.

Global Optimization

To set up the Levenberg-Marquardt non-linear optimization problem, measurements of the parameters ($x$, $h_n$, $h_v$, $h_t$) are made in line locator 11. The h values are measured simultaneously using horizontal (peak) coil 14, vertical (null) coil 19, and top coil 20. In some embodiments, a demodulation approach such as that described in the '239 application can be utilized. In this way it is possible to fit both the horizontal model, the vertical model, and/or the top model using optimization 23 and select the best-behaved model from the statistics that are inherent in the optimization process.

Figure 6:
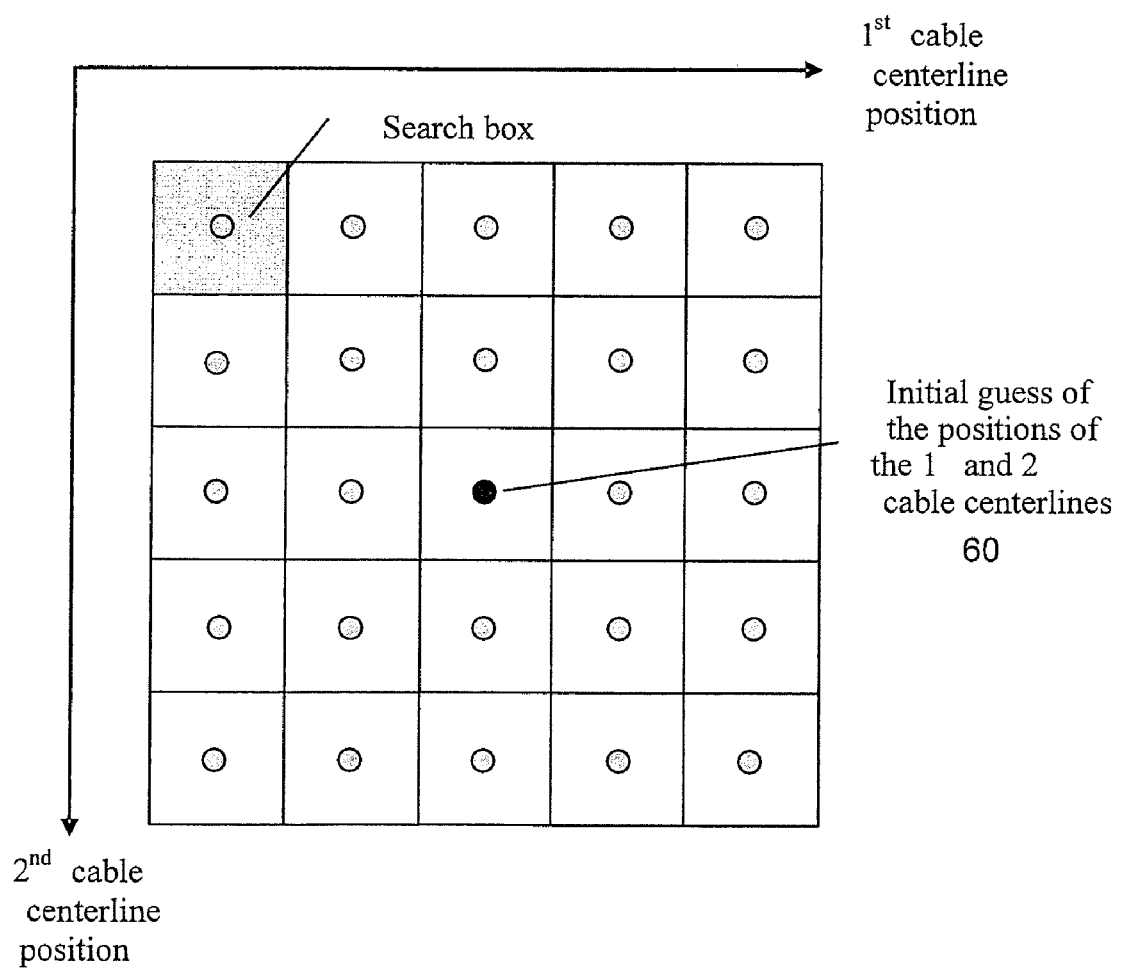
FIG. 6 illustrates an exemplary "grid and search" method for estimating a cable location.

Due to the nature of nonlinearity, a global solution is not guaranteed. More often than not, a local minimum might lead to a false line location. Here, some embodiments consistent with the present invention use a "grid and search" method to estimate the true line location, as provided in FIG. 6, based on the following:

1) Based on the measurement, figure out an initial estimate of the $1^{st}$ line centerline position (e.g., center dot 60);
2) Surround this initial estimate with a square box the size of, for example, 6"×6" (default size, subject to user definition).
3) Surround this box both horizontally and vertically with many of the same size, to a larger box with user defined size.
4) Within each small box, the center coordinates can be the initial centerline positions and steps of the $1^{st}$ and $2^{nd}$ line, and the box can be the boundary conditions of the centerlines of these two lines. An optimization is performed for each box and a local solution can be found within each box.

The above steps can essentially generate many local solutions, with the "true" solution buried in them. The next step can be to pick the "true" solution and exclude the false solutions. For each local solution, the following steps are performed:

1) Compute Fit based on the following equation $$S(a) = \sum_{j=1}^{N} \|y_j - y(x_j; a)\|^2$$

$$= \sum_j \left\{ \begin{array}{l} \left[\frac{h_n^I(x_j)_{meas} -}{h_n^I(x_j)_{mod}}\right]^2 + \left[\frac{h_n^Q(x_j)_{meas} -}{h_n^Q(x_j)_{mod}}\right]^2 + \\ \left[\frac{h_v^I(x_j)_{meas} -}{h_v^I(x_j)_{mod}}\right]^2 + \left[\frac{h_v^Q(x_j)_{meas} -}{h_v^Q(x_j)_{mod}}\right]^2 + \\ \left[\frac{h_t^I(x_j)_{meas} -}{h_n^I(x_j)_{mod}}\right]^2 + \left[\frac{h_n^Q(x_j)_{meas} -}{h_v^Q(x_j)_{mod}}\right]^2 \end{array} \right\}$$

$$fsMagSum = \sum_j \left[\begin{array}{l} h_n^I(x_j)^2 + h_n^Q(x_j)^2 + h_v^I(x_j)^2 + \\ h_v^Q(x_j)^2 + h_t^I(x_j)^2 + h_t^Q(x_j)^2 \end{array}\right]$$

$$Fit = \sqrt{\frac{fsMagSum}{\left(\frac{S(a)}{(n-p)}\right)}}$$

where,
n is total number of measurements, and
p is the total number of parameters.

2) Check the estimated current and phase relationship and compute the effective Fit, effFit. The primary (target) line parameter vector is $[x_0, z_0, I_0, \phi_0, dI_0, d\phi_0]$. Assuming that the transfer function of the current along the target line is a stable minimum phase system (no RHP poles and zeros), the phase at a certain frequency f can roughly be related to the slope of the gain Bode plot. For determining $\phi_0$ based on a Bode plot:

$$\phi_0 = 90° \cdot N(f_0)$$

where, $N(f_0)$ is the slope of the gain Bode plot at frequency $f_0$. Assuming that the current gain Bode plot started roll-off at frequency $f_{0/100}$:

$$\frac{I_0}{I_{max}} \geq \left(\frac{f_0}{f_0/100}\right)^{N(f_0)} = 100^{N(f_0)}$$

To create an upper bound for $I_0$, it is assumed that the current Bode plot started roll-off at half locating frequency, $$\frac{I_0}{I_{max}} \leq \left(\frac{f_0}{f_0/2}\right)^{N(f_0)} = 2^{N(f_0)}.$$

Therefore, the current estimate should fall into the following range:

$$I_{max} \cdot 100^{N(f_0)} \leq I_0 \leq I_{max} \cdot 2^{N(f_0)}$$

$$N(f_0) = \phi_0/90°.$$

If the estimated current violates the above range, the Fit can be penalized in the following way:

$$factor1 = \min\left(1, \frac{I_0}{I_{max} \cdot 100^{N(f_0)}}, \frac{I_{max} \cdot 2^{N(f_0)}}{I_0}\right).$$

$$effFit = factor1 \cdot Fit$$

3) Check the estimated current attenuation at the side tones and update the effective Fit, effFit Define $I_0^+, I_0^-$ as the current amplitude at the two side tone frequencies of the primary line in Signal-Select mode. $dI_0$ can be described in the following equation:

$$dI_0 = \frac{I_0^+ - I_0^-}{I_0^-} = \frac{I_0^+}{I_0^-} - 1$$

$$\frac{I_0^+}{I_0^-} = 1 + dI_0.$$

The ratio of the frequencies at the side tones, where $n=8$, is $(2n+1)/(2n-1) = 17/15$, giving the following:

$$\frac{I_0^+}{I_0^-} = 1 + dI_0 = \left(\frac{17}{15}\right)^{N(f_0)}$$

Introducing another factor2 to penalize the effFit if the above relationship is violated:

$$factor2 = 1 - \left|1 + dI_0 - \left(\frac{17}{15}\right)^{N(f_0)}\right|$$

$$effFit = factor2 \cdot effFit$$

4) Introduce BLEEDFAC to penalize the total number of lines in the Fit:

effFit=effFit/BleedFac where, BleedFac=1 if there is no bleedover line; BleedFac=$2^{1/4}$ for one bleedover line; BleedFac=$4^{1/4}$ for two bleedover line; BleedFac=$8^{1/4}$ for three bleedover lines.

5) Check if any of the secondary lines are "too close" to the primary line. If the distance between the primary and secondary lines is less than 1.5", that solution can be treated as a false location and excluded.

6) Check the uncertainty bound box of the solution (centerline and depth). If estimated centerline error is greater than 24", or the diagonal of the error box (centerline and depth) is greater than 36", the solution can be excluded.

7) After all, the solution with the largest effFit is the one to be picked.

The method described above has been verified through a lot of field data collected at places where the field is distorted by the other lines with bleedover and/or return current. So far, this method is able to identify the true line location with certain confidence intervals.

In general, the current phase measurement of the target line in Signal-Select mode can be biased due to the presence of bleedover lines. The error term however can be modeled as a function of locations, current and phase of each line, plus a current amplitude and phase variations. An enhanced electromagnetic field model including this phase measurement error is used in the precise locating method. A global optimization approach is proposed to find the true line location among many false locations.

All Appendices (Appendix 1 and Appendix 2) are considered part of this disclosure and are herein incorporated by reference in their entirety. The embodiments described herein are examples only of the invention. Other embodiments of the invention that are within the scope and spirit of this disclosure will be apparent to those skilled in the art from consideration of the specification and practice of the invention disclosed herein. It is intended that the specification and examples be considered as exemplary only and not limiting. The scope of the invention, therefore, is limited only by the following claims.

APPENDIX I

Computation of Fourier Series Coefficients

The Fourier series coefficients $a_k$ and $b_k$ are calculated for Equation (21) according to the following steps:

$$(T_1 + T_2) \cdot a_{2n} = \int_0^{T_1+T_2} 2 \cdot I(t) \cdot \cos(2n \cdot \omega_m t) \, dt$$

$$= \int_0^{T_1} 2 \cdot I_{tx} \cdot \cos(\omega_1 t) \cdot \cos(\omega_0 t) \, dt +$$

$$\int_{T_1}^{T_1+T_2} 2 \cdot I_{tx} \cdot \cos(\omega_2(t-T_1)) \cdot \cos(\omega_0 t) \, dt$$

$$= \int_0^{T_1} I_{tx} \cdot \cos[(\omega_1 + \omega_0)t] \, dt +$$

$$\int_0^{T_1} I_{tx} \cdot \cos[(\omega_1 - \omega_0)t] \, dt +$$

$$\int_{T_1}^{T_1+T_2} I_{tx} \cdot \cos[(\omega_2 + \omega_0)t - \omega_2 T_1] \, dt +$$

$$\int_{T_1}^{T_1+T_2} I_{tx} \cdot \cos[(\omega_2 - \omega_0)t - \omega_2 T_1] \, dt$$

$$= \frac{I_{tx}}{\omega_1 + \omega_0} \cdot \sin(-2n\pi\Delta) + \frac{I_{tx}}{\omega_1 - \omega_0} \cdot \sin(2n\pi\Delta) +$$

$$\frac{I_{tx}}{\omega_2 + \omega_0} \cdot \sin(2n\pi\Delta) + \frac{I_{tx}}{\omega_2 - \omega_0} \cdot [-\sin(2n\pi\Delta)]$$

$$\approx \frac{I_{tx}}{\omega_0 \cdot \Delta} \cdot \sin(2n\pi\Delta) + \frac{I_{tx}}{-\omega_0 \cdot \Delta} \cdot [-\sin(2n\pi\Delta)]$$

$$= \frac{2 I_{tx}}{\omega_0 \cdot \Delta} \cdot \sin(2n\pi\Delta)$$

leading to $$a_{2n} \approx \frac{2 I_{tx} \sin(2n\pi\Delta)}{(T_1 + T_2) \cdot \omega_0 \Delta} = \frac{I_{tx} \sin(n\pi\Delta) \cdot \cos(n\pi\Delta)}{n\pi\Delta}$$

$$(T_1 + T_2) \cdot b_{2n} = \int_0^{T_1+T_2} 2 \cdot I(t) \cdot \sin(2n \cdot \omega_m t) \, dt$$

$$= \int_0^{T_1} 2 \cdot I_{tx} \cdot \cos(\omega_1 t) \cdot \sin(\omega_0 t) \, dt +$$

$$\int_{T_1}^{T_1+T_2} 2 \cdot I_{tx} \cdot \cos(\omega_2(t-T_1)) \cdot \sin(\omega_0 t) \, dt$$

$$= \int_0^{T_1} I_{tx} \cdot \sin[(\omega_1 + \omega_0)t] \, dt - \int_0^{T_1} I_{tx} \cdot$$

$$\sin[(\omega_1 - \omega_0)t] \, dt + \int_{T_1}^{T_1+T_2} I_{tx} \cdot$$

$$\sin[(\omega_2 + \omega_0)t - \omega_2 T_1] \, dt - \int_T^{T_1+T_2} I_{tx} \cdot$$

$$\sin[(\omega_2 - \omega_0)t - \omega_2 T_1] \, dt$$

$$= \frac{I_{tx}}{\omega_1 + \omega_0} \cdot [1 - \cos(2n\pi\Delta)] + \frac{I_{tx}}{\omega_1 - \omega_0} \cdot$$

$$[\cos(2n\pi\Delta) - 1] + \frac{I_{tx}}{\omega_2 + \omega_0} \cdot [\cos(2n\pi\Delta) - 1] +$$

$$\frac{I_{tx}}{\omega_2 - \omega_0} \cdot [1 - \cos(2n\pi\Delta)]$$

$$\approx \frac{I_{tx}}{\omega_0 \cdot \Delta} \cdot [\cos(2n\pi\Delta) - 1] + \frac{I_{tx}}{-\omega_0 \cdot \Delta} \cdot$$

$$[1 - \cos(2n\pi\Delta)]$$

$$= \frac{2 I_{tx}}{\omega_0 \cdot \Delta} \cdot [\cos(2n\pi\Delta) - 1]$$

$$= \frac{-4 I_{tx} \sin^2(n\pi\Delta)}{\omega_0 \cdot \Delta}$$

leads to $$b_{2n} \approx \frac{-4 I_{tx} \sin^2(n\pi\Delta)}{(T_1 + T_2) \omega_0 \cdot \Delta} = \frac{-I_{tx} \sin^2(n\pi\Delta)}{n\pi\Delta}.$$

Therefore, the main tone can be expressed as:

$$a_{2n} \cdot \cos(\omega_0 t) + b_{2n} \cdot \sin(\omega_0 t) \approx \frac{I_{tx} \sin(n\pi\Delta) \cdot \cos(n\pi\Delta)}{n\pi\Delta} \cdot \cos(\omega_0 t) +$$

$$\frac{-I_{tx} \sin^2(n\pi\Delta)}{n\pi\Delta} \cdot \sin(\omega_0 t).$$

$$= \frac{I_{tx} \sin(n\pi\Delta)}{n\pi\Delta} \cdot \cos(\omega_0 t + n\pi\Delta)$$

$$(T_1 + T_2) \cdot a_{2n+1} = \int_0^{T_1+T_2} 2 \cdot I(t) \cdot \cos(\omega_0^+ t) \, dt$$

$$= \int_0^{T_1} 2 \cdot I_{tx} \cdot \cos(\omega_1 t) \cdot \cos(\omega_0^+ t) \, dt +$$

$$\int_{T_1}^{T_1+T_2} 2 \cdot I_{tx} \cdot \cos(\omega_2(t-T_1)) \cdot \cos(\omega_0^+ t) \, dt$$

$$= \int_0^{T_1} I_{tx} \cdot \cos[(\omega_1 + \omega_0^+)t] \, dt +$$

$$\int_0^{T_1} I_{tx} \cdot \cos[(\omega_1 - \omega_0^+)t] \, dt + \int_{T_1}^{T_1+T_2} I_{tx} \cdot$$

$$\cos[(\omega_2 + \omega_0^+)t - \omega_2 T_1] \, dt + \int_T^{T_1+T_2} I_{tx} \cdot$$

$$\cos[(\omega_2 - \omega_0^+)t - \omega_2 T_1] \, dt$$

$$= \frac{I_{tx}}{\omega_1 + \omega_0^+} \cdot \sin(\omega_0^+ T_1) + \frac{I_{tx}}{\omega_1 - \omega_0^+} \cdot \sin(-\omega_0^+ T_1) +$$

$$\frac{I_{tx}}{\omega_2 + \omega_0^+} \cdot [-\sin(\omega_0^+ T_1)] + \frac{I_{tx}}{\omega_2 - \omega_0^+} \cdot \sin(\omega_0^+ T_1)$$

$$\approx \frac{2n I_{tx}}{(2n\Delta - 1)\omega_0} \cdot \sin(-\omega_0^+ T_1) + \frac{-2n I_{tx}}{(2n\Delta + 1)\omega_0} \cdot$$

$$\sin(\omega_0^+ T_1)$$

$$= \frac{2n I_{tx} \cdot 4n\Delta \cdot \sin(\omega_0^+ T_1)}{[1 - (2n\Delta)^2] \cdot \omega_0}$$

leads to $$a_{2n+1} \approx \frac{2n I_{tx} \cdot 4n\Delta \cdot \sin(\omega_0^+ T_1)}{[1 - (2n\Delta)^2] \cdot (T_1 + T_2)\omega_0}$$

$$= \frac{2n\Delta/\pi \cdot I_{tx} \cdot \sin(\omega_0^+ T_1)}{[1 - (2n\Delta)^2]}.$$

$$(T_1 + T_2) \cdot b_{2n+1} = \int_0^{T_1+T_2} 2 \cdot I(t) \cdot \sin(\omega_0^+ t) \, dt$$

$$= \int_0^{T_1} 2 \cdot I_{tx} \cdot \cos(\omega_1 t) \cdot \sin(\omega_0^+ t) \, dt +$$

$$\int_{T_1}^{T_1+T_2} 2 \cdot I_{tx} \cdot \cos(\omega_2(t-T_1)) \cdot \sin(\omega_0^+ t) \, dt$$

$$= \int_0^{T_1} I_{tx} \cdot \sin[(\omega_1 + \omega_0^+)t] \, dt - \int_0^{T_1} I_{tx} \cdot$$

$$\sin[(\omega_1 - \omega_0^+)t] \, dt + \int_{T_1}^{T_1+T_2} I_{tx} \cdot$$

$$\sin[(\omega_2 + \omega_0^+)t - \omega_2 T_1] \, dt - \int_{T_1}^{T_1+T_2} I_{tx} \cdot$$

$$\sin[(\omega_2 + \omega_0^+)t - \omega_2 T_1] \, dt$$

$$= \frac{I_{tx}}{\omega_1 + \omega_0^+} \cdot [1 - \cos(\omega_0^+ T_1)] + \frac{I_{tx}}{\omega_1 - \omega_0^+} \cdot$$

$$[\cos(-\omega_0^+ T_1) - 1] + \frac{I_{tx}}{\omega_2 + \omega_0^+} \cdot$$

$$[\cos(\omega_0^+ T_1) - 1] + \frac{I_{tx}}{\omega_2 - \omega_0^+} \cdot [1 - \cos(-\omega_0^+ T_1)]$$

$$\approx \frac{2n I_{tx}}{(2n\Delta - 1)\omega_0} \cdot [\cos(\omega_0^+ T_1) - 1] + \frac{-2n I_{tx}}{(2n\Delta + 1)\omega_0} \cdot$$

$$[1 - \cos(-\omega_0^+ T_1)]$$

$$= \frac{2n I_{tx} \cdot 4n\Delta}{\omega_0 \cdot ((2n\Delta)^2 - 1)} \cdot [\cos(\omega_0^+ T_1) - 1]$$

leads to $$b_{2n+1} \approx \frac{2nI_{tx} \cdot 4n\Delta}{(T_1 + T_2)\omega_0 \cdot ((2n\Delta)^2 - 1)} \cdot [\cos(\omega_0^+ T_1) - 1]$$
$$= \frac{I_{tx} \cdot 4n\Delta/\pi}{(1 - (2n\Delta)^2)} \cdot \sin^2\left(\frac{\omega_0^+ T}{2}\right).$$

$$(T_1 + T_2) \cdot a_{2n-1} = \int_0^{T_1+T_2} 2 \cdot I(t) \cdot \cos(\omega_0^- t) dt$$
$$= \int_0^{T_1} 2 \cdot I_{tx} \cdot \cos(\omega_1 t) \cdot \cos(\omega_0^- t) dt +$$
$$\int_{T_1}^{T_1+T_2} 2 \cdot I_{tx} \cdot \cos(\omega_2(t - T_1)) \cdot \cos(\omega_0^- t) dt$$
$$= \int_0^{T_1} I_{tx} \cdot \cos[(\omega_1 + \omega_0^-)t] dt +$$
$$\int_0^{T_1} I_{tx} \cdot \cos[(\omega_1 - \omega_0^-)t] dt + \int_{T_1}^{T_1+T_2} I_{tx} \cdot$$
$$\cos[(\omega_2 + \omega_0^-)t - \omega_2 T_1] dt + \int_{T_1}^{T_1+T_2} I_{tx} \cdot$$
$$\cos[(\omega_2 - \omega_0^-)t - \omega_2 T_1] dt$$
$$= \frac{I_{tx}}{\omega_1 + \omega_0^-} \cdot \sin(\omega_0^- T_1) + \frac{I_{tx}}{\omega_1 - \omega_0^-} \cdot \sin(-\omega_0^- T_1) +$$
$$\frac{I_{tx}}{\omega_2 + \omega_0^-} \cdot [-\sin(\omega_0^- T_1)] + \frac{I_{tx}}{\omega_2 - \omega_0^-} \cdot \sin(\omega_0^- T_1)$$
$$\approx \frac{2nI_{tx}}{(2n\Delta + 1)\omega_0} \cdot \sin(-\omega_0^- T_1) + \frac{2nI_{tx}}{(1 - 2n\Delta)\omega_0} \cdot \sin(\omega_0^- T_1)$$
$$= \frac{2nI_{tx} \cdot 4n\Delta \cdot \sin(\omega_0^- T_1)}{[1 - (2n\Delta)^2] \cdot \omega_0}$$

leads to $$a_{2n-1} \approx \frac{2nI_{tx} \cdot 4n\Delta \cdot \sin(\omega_0^- T_1)}{[1 - (2n\Delta)^2] \cdot (T_1 + T_2)\omega_0}$$
$$= \frac{I_{tx} \cdot 2n\Delta/\pi}{[1 - (2n\Delta)^2]} \cdot \sin(\omega_0^- T_1).$$

$$(T_1 + T_2) \cdot b_{2n-1} = \int_0^{T_1+T_2} 2 \cdot I(t) \cdot \sin(\omega_0^- t) dt$$
$$= \int_0^{T_1} 2 \cdot I_{tx} \cdot \cos(\omega_1 t) \cdot \sin(\omega_0^- t) dt +$$
$$\int_{T_1}^{T_1+T_2} 2 \cdot I_{tx} \cdot \cos(\omega_2(t - T_1)) \cdot \sin(\omega_0^- t) dt$$
$$= \int_0^{T_1} I_{tx} \cdot \sin[(\omega_1 + \omega_0^-)t] dt - \int_0^{T_1} I_{tx} \cdot$$
$$\sin[(\omega_1 - \omega_0^-)t] dt + \int_{T_1}^{T_1+T_2} I_{tx} \cdot$$
$$\sin[(\omega_2 + \omega_0^-)t - \omega_2 T_1] dt - \int_{T_1}^{T_1+T_2} I_{tx} \cdot$$
$$\sin[(\omega_2 - \omega_0^-)t - \omega_2 T_1] dt$$
$$= \frac{I_{tx}}{\omega_1 + \omega_0^-} \cdot [1 - \cos(\omega_0^- T_1)] + \frac{I_{tx}}{\omega_1 - \omega_0^-} \cdot$$
$$[\cos(-\omega_0^- T_1) - 1] + \frac{I_{tx}}{\omega_2 + \omega_0^-} \cdot [\cos(\omega_0^- T_1) - 1] +$$
$$\frac{I_{tx}}{\omega_2 - \omega_0^-} \cdot [1 - \cos(-\omega_0^- T_1)]$$
$$\approx \frac{2nI_{tx}}{(2n\Delta + 1)\omega_0} \cdot [\cos(\omega_0^- T_1) - 1] + \frac{2nI_{tx}}{(1 - 2n\Delta)\omega_0} \cdot$$
$$[1 - \cos(\omega_0^- T_1)]$$
$$= \frac{2nI_{tx} \cdot 4n\Delta}{\omega_0 \cdot (1 - (2n\Delta)^2)} \cdot [1 - \cos(\omega_0^- T_1)]$$

leads to $$b_{2n-1} = \frac{2nI_{tx} \cdot 4n\Delta}{(T_1 + T_2)\omega_0 \cdot (1 - (2n\Delta)^2)} \cdot [1 - \cos(\omega_0^- T_1)]$$
$$= \frac{I_{tx} \cdot 4n\Delta/\pi}{(1 - (2n\Delta)^2)} \cdot \sin^2\left(\frac{\omega_0^- T}{2}\right).$$

So the two side tones can be expressed as $$a_{2n-1} \cdot \cos(\omega_0^- t) + b_{2n-1} \cdot \sin(\omega_0^- t) \approx \frac{2n\Delta/\pi \cdot I_{tx} \cdot \sin(\omega_0^- T_1)}{[1 - (2n\Delta)^2]} \cdot$$
$$\cos(\omega_0^- t) + \frac{I_{tx} \cdot 4n\Delta/\pi}{(1 - (2n\Delta)^2)} \cdot$$
$$\sin^2\left(\frac{\omega_0^- T}{2}\right) \cdot \sin(\omega_0^- t)$$
$$= \frac{I_{tx} \cdot 4n\Delta/\pi}{(1 - (2n\Delta)^2)} \cdot \sin\left(\frac{\omega_0^- T}{2}\right) \cdot$$
$$\cos\left(\omega_0^- t - \frac{\omega_0^- T}{2}\right)$$

$$a_{2n+1} \cdot \cos(\omega_0^+ t) + b_{2n+1} \cdot \sin(\omega_0^+ t) \approx \frac{2n\Delta/\pi \cdot I_{tx} \cdot \sin(\omega_0^+ T_1)}{[1 - (2n\Delta)^2]} \cdot$$
$$\cos(\omega_0^+ t) + \frac{I_{tx} \cdot 4n\Delta/\pi}{(1 - (2n\Delta)^2)} \cdot$$
$$\sin^2\left(\frac{\omega_0^+ T}{2}\right) \cdot \sin(\omega_0^+ t)$$
$$= \frac{I_{tx} \cdot 4n\Delta/\pi}{(1 - (2n\Delta)^2)} \cdot \sin\left(\frac{\omega_0^+ T}{2}\right) \cdot$$
$$\cos\left(\omega_0^+ t - \frac{\omega_0^+ T_1}{2}\right)$$

APPENDIX II

Phase Error Derivation

Appendix II provides the following detailed analysis for calculating the phase error derivation according to Equation (37).

$$(1 + \delta) \cdot [\cos(\omega_m t + \omega_0^- T_1 + n\pi\Delta + \varphi_0 - \varphi_0^-) - \cos(\omega_m t + n\pi\Delta + \varphi_0 - \varphi_0^-)] +$$
$$(1 - \delta) \cdot [\cos(-\omega_m t + \omega_0^+ T_1 + n\pi\Delta + \varphi_0 - \varphi_0^+) -$$
$$\cos(-\omega_m t + n\pi\Delta + \varphi_0 - \varphi_0^+)] =$$
$$[\cos(\omega_m t + \omega_0^- T_1 + n\pi\Delta + \varphi_0 - \varphi_0^-) + \cos(-\omega_m t + \omega_0^+ T_1 + n\pi\Delta + \varphi_0 - \varphi_0^+)] -$$
$$[\cos(\omega_m t + n\pi\Delta + \varphi_0 - \varphi_0^-) + \cos(-\omega_m t + n\pi\Delta + \varphi_0 - \varphi_0^+)] +$$
$$\delta \cdot [\cos(\omega_m t + \omega_0^- T_1 + n\pi\Delta + \varphi_0 - \varphi_0^-) -$$
$$\cos(-\omega_m t + \omega_0^+ T_1 + n\pi\Delta + \varphi_0 - \varphi_0^+)] -$$
$$\delta \cdot [\cos(\omega_m t + n\pi\Delta + \varphi_0 - \varphi_0^-) - \cos(-\omega_m t + n\pi\Delta + \varphi_0 - \varphi_0^+)]$$
$$\cos(\omega_m t + \omega_0^- T_1 + n\pi\Delta + \varphi_0 - \varphi_0^-) +$$
$$\cos(-\omega_m t + \omega_0^+ T_1 + n\pi\Delta + \varphi_0 - \varphi_0^+) =$$
$$2\cos\left(\omega_0^- T_1 + n\pi\Delta + \varphi_0 - \frac{\varphi_0^- + \varphi_0^+}{2}\right) \cdot \cos\left(\omega_m t - \omega_m T_1 - \frac{\varphi_0^- - \varphi_0^+}{2}\right)$$
$$\cos(\omega_m t + n\pi\Delta + \varphi_0 - \varphi_0^-) + \cos(-\omega_m t + n\pi\Delta + \varphi_0 - \varphi_0^+) =$$
$$2\cos\left(n\pi\Delta + \varphi_0 - \frac{\varphi_0^- + \varphi_0^+}{2}\right) \cdot \cos\left(\omega_m t - \frac{\varphi_0^- - \varphi_0^+}{2}\right)$$

-continued $$\cos(\omega_m t + \omega_0^- T_1 + n\pi\Delta + \varphi_0 - \varphi_0^-) - \cos(-\omega_m t + \omega_0^+ T_1 + n\pi\Delta + \varphi_0 - \varphi_0^+) =$$

$$-2\sin\left(\omega_0 T_1 + n\pi\Delta + \varphi_0 - \frac{\varphi_0^- + \varphi_0^+}{2}\right) \cdot$$

$$\sin\left(\omega_m t - \omega_m T_1 - \frac{\varphi_0^- - \varphi_0^+}{2}\right)\cos(\omega_m t + n\pi\Delta + \varphi_0 - \varphi_0^-) -$$

$$\cos(-\omega_m t + n\pi\Delta + \varphi_0 - \varphi_0^+) =$$

$$2\sin\left(n\pi\Delta + \varphi_0 - \frac{\varphi_0^- + \varphi_0^+}{2}\right) \cdot \sin\left(\omega_m t - \frac{\varphi_0^- - \varphi_0^+}{2}\right).$$

Since $\omega_0 T_1 + n\pi\Delta = (1-\Delta) \cdot 2n\pi + n\pi\Delta$
$= 2n\pi - \Delta n\pi$, then $$[\cos(\omega_m t + \omega_0^- T_1 + n\pi\Delta + \varphi_0 - \varphi_0^-) +$$
$$\cos(-\omega_m t + \omega_0^+ T_1 + n\pi\Delta + \varphi_0 - \varphi_0^+)] -$$
$$[\cos(\omega_m t + n\pi\Delta + \varphi_0 - \varphi_0^-) + \cos(-\omega_m t + n\pi\Delta + \varphi_0 - \varphi_0^+)] =$$

$$2\cos\left(\omega_0 T_1 + n\pi\Delta + \varphi_0 - \frac{\varphi_0^- + \varphi_0^+}{2}\right) \cdot \cos\left(\omega_m t - \omega_m T_1 - \frac{\varphi_0^- - \varphi_0^+}{2}\right) -$$

$$2\cos\left(n\pi\Delta + \varphi_0 - \frac{\varphi_0^- + \varphi_0^+}{2}\right) \cdot \cos\left(\omega_m t - \frac{\varphi_0^- - \varphi_0^+}{2}\right) =$$

$$2\cos\left(2n\pi - \Delta n\pi + \varphi_0 - \frac{\varphi_0^- + \varphi_0^+}{2}\right) \cdot \cos\left(\omega_m t - \omega_m T_1 - \frac{\varphi_0^- - \varphi_0^+}{2}\right) -$$

$$2\cos\left(n\pi\Delta + \varphi_0 - \frac{\varphi_0^- + \varphi_0^+}{2}\right) \cdot \cos\left(\omega_m t - \frac{\varphi_0^- - \varphi_0^+}{2}\right) =$$

$$2\cos\left(-\Delta n\pi + \varphi_0 - \frac{\varphi_0^- + \varphi_0^+}{2}\right) \cdot \cos\left(\omega_m t - \omega_m T_1 - \frac{\varphi_0^- - \varphi_0^+}{2}\right) -$$

$$2\cos\left(n\pi\Delta + \varphi_0 - \frac{\varphi_0^- + \varphi_0^+}{2}\right) \cdot \cos\left(\omega_m t - \frac{\varphi_0^- - \varphi_0^+}{2}\right) =$$

$$2\cos\left(\omega_m t - \omega_m T_1 - \frac{\varphi_0^- - \varphi_0^+}{2}\right) \cdot \left[\cos(\Delta n\pi) \cdot \cos\left(\varphi_0 - \frac{\varphi_0^- + \varphi_0^+}{2}\right) + \right.$$

$$\left.\sin(\Delta n\pi) \cdot \sin\left(\varphi_0 - \frac{\varphi_0^- + \varphi_0^+}{2}\right)\right] - 2\cos\left(\omega_m t - \frac{\varphi_0^- - \varphi_0^+}{2}\right) \cdot$$

$$\left[\cos(\Delta n\pi) \cdot \cos\left(\varphi_0 - \frac{\varphi_0^- + \varphi_0^+}{2}\right) - \sin(\Delta n\pi) \cdot \sin\left(\varphi_0 - \frac{\varphi_0^- + \varphi_0^+}{2}\right)\right] =$$

$$2\cos(\Delta n\pi) \cdot \cos\left(\varphi_0 - \frac{\varphi_0^- + \varphi_0^+}{2}\right) \cdot \left[\cos\left(\omega_m t - \omega_m T_1 - \frac{\varphi_0^- - \varphi_0^+}{2}\right) - \right.$$

$$\left.\cos\left(\omega_m t - \frac{\varphi_0^- - \varphi_0^+}{2}\right)\right] + 2\sin(\Delta n\pi) \cdot \sin\left(\varphi_0 - \frac{\varphi_0^- + \varphi_0^+}{2}\right) \cdot$$

$$\left[\cos\left(\omega_m t - \omega_m T_1 - \frac{\varphi_0^- - \varphi_0^+}{2}\right) + \cos\left(\omega_m t - \frac{\varphi_0^- - \varphi_0^+}{2}\right)\right]$$

Since $\omega_m T_1 = (1-\Delta) \cdot \pi = \pi - \Delta\pi$, then $$[\cos(\omega_m t + \omega_0^- T_1 + n\pi\Delta + \varphi_0 - \varphi_0^-) + \cos(-\omega_m t + \omega_0^+ T_1 + n\pi\Delta + \varphi_0 - \varphi_0^+)] -$$
$$[\cos(\omega_m t + n\pi\Delta + \varphi_0 - \varphi_0^-) +$$
$$\cos(-\omega_m t + n\pi\Delta + \varphi_0 - \varphi_0^+)] =$$

$$2\cos(\Delta n\pi) \cdot \cos\left(\varphi_0 - \frac{\varphi_0^- + \varphi_0^+}{2}\right) \cdot \left[\cos\left(\omega_m t - \frac{\varphi_0^- - \varphi_0^+}{2} + \Delta\pi - \pi\right) - \right.$$

$$\left.\cos\left(\omega_m t - \frac{\varphi_0^- - \varphi_0^+}{2}\right)\right] + 2\sin(\Delta n\pi) \cdot$$

$$\sin\left(\varphi_0 - \frac{\varphi_0^- + \varphi_0^+}{2}\right) \cdot \left[\cos\left(\omega_m t - \frac{\varphi_0^- - \varphi_0^+}{2} + \Delta\pi - \pi\right) + \right.$$

$$\left.\cos\left(\omega_m t - \frac{\varphi_0^- - \varphi_0^+}{2}\right)\right] = 2\cos(\Delta n\pi) \cdot \cos\left(\varphi_0 - \frac{\varphi_0^- + \varphi_0^+}{2}\right) \cdot$$

$$\left[-\cos\left(\omega_m t - \frac{\varphi_0^- - \varphi_0^+}{2} + \Delta\pi\right) - \cos\left(\omega_m t - \frac{\varphi_0^- - \varphi_0^+}{2}\right)\right] + 2\sin(\Delta n\pi) \cdot$$

$$\sin\left(\varphi_0 - \frac{\varphi_0^- + \varphi_0^+}{2}\right) \cdot \left[-\cos\left(\omega_m t - \frac{\varphi_0^- - \varphi_0^+}{2} + \Delta\pi\right) + \right.$$

$$\left.\cos\left(\omega_m t - \frac{\varphi_0^- - \varphi_0^+}{2}\right)\right] =$$

$$-4\cos(\Delta n\pi) \cdot \cos\left(\varphi_0 - \frac{\varphi_0^- + \varphi_0^+}{2}\right) \cdot \cos\left(\frac{\Delta\pi}{2}\right) \cdot \cos\left(\omega_m t - \frac{\varphi_0^- - \varphi_0^+}{2} + \frac{\Delta\pi}{2}\right) +$$

$$4\sin(\Delta n\pi) \cdot \sin\left(\varphi_0 - \frac{\varphi_0^- + \varphi_0^+}{2}\right) \cdot$$

$$\sin\left(\frac{\Delta\pi}{2}\right) \cdot \sin\left(\omega_m t - \frac{\varphi_0^- - \varphi_0^+}{2} + \frac{\Delta\pi}{2}\right) \approx -4\cos(\Delta n\pi) \cdot$$

$$\cos\left(\varphi_0 - \frac{\varphi_0^- + \varphi_0^+}{2}\right) \cdot \cos\left(\frac{\Delta\pi}{2}\right) \cdot \cos\left(\omega_m t + \frac{\Delta\pi}{2} - \frac{\varphi_0^- - \varphi_0^+}{2} + \delta\varphi\right)$$

$$\delta \cdot [\cos(\omega_m t + \omega_0^- T_1 + n\pi\Delta + \varphi_0 - \varphi_0^-) - \cos(-\omega_m t + \omega_0^+ T_1 + n\pi\Delta + \varphi_0 - \varphi_0^+)] - \delta \cdot [\cos(\omega_m t + n\pi\Delta + \varphi_0 - \varphi_0^-) -$$
$$\cos(-\omega_m t + n\pi\Delta + \varphi_0 - \varphi_0^+)] =$$

$$-2\delta \cdot \sin\left(\omega_0 T_1 + n\pi\Delta + \varphi_0 - \frac{\varphi_0^- + \varphi_0^+}{2}\right) \cdot \sin\left(\omega_m t - \omega_m T_1 - \frac{\varphi_0^- - \varphi_0^+}{2}\right) +$$

$$2\delta \cdot \sin\left(n\pi\Delta + \varphi_0 - \frac{\varphi_0^- + \varphi_0^+}{2}\right) \cdot$$

$$\sin\left(\omega_m t - \frac{\varphi_0^- - \varphi_0^+}{2}\right) =$$

$$-2\delta \cdot \sin\left(2n\pi - n\pi\Delta + \varphi_0 - \frac{\varphi_0^- + \varphi_0^+}{2}\right) \cdot \sin\left(\omega_m t - \omega_m T_1 - \frac{\varphi_0^- - \varphi_0^+}{2}\right) +$$

$$2\delta \cdot \sin\left(n\pi\Delta + \varphi_0 - \frac{\varphi_0^- + \varphi_0^+}{2}\right) \cdot \sin\left(\omega_m t - \frac{\varphi_0^- - \varphi_0^+}{2}\right) =$$

$$-2\delta \cdot \sin\left(-n\pi\Delta + \varphi_0 - \frac{\varphi_0^- + \varphi_0^+}{2}\right) \cdot \sin\left(\omega_m t - \omega_m T_1 - \frac{\varphi_0^- - \varphi_0^+}{2}\right) +$$

$$2\delta \cdot \sin\left(n\pi\Delta + \varphi_0 - \frac{\varphi_0^- + \varphi_0^+}{2}\right) \cdot \sin\left(\omega_m t - \frac{\varphi_0^- - \varphi_0^+}{2}\right) =$$

$$-2\delta \cdot \sin\left(\omega_m t - \omega_m T_1 - \frac{\varphi_0^- - \varphi_0^+}{2}\right) \cdot \left[-\sin(n\pi\Delta) \cdot \cos\left(\varphi_0 - \frac{\varphi_0^- + \varphi_0^+}{2}\right) + \right.$$

$$\left.\cos(n\pi\Delta) \cdot \sin\left(\varphi_0 - \frac{\varphi_0^- + \varphi_0^+}{2}\right)\right] + 2\delta \cdot \sin\left(\omega_m t - \frac{\varphi_0^- - \varphi_0^+}{2}\right) \cdot$$

$$\left[\sin(n\pi\Delta) \cdot \cos\left(\varphi_0 - \frac{\varphi_0^- + \varphi_0^+}{2}\right) + \cos(n\pi\Delta) \cdot \sin\left(\varphi_0 - \frac{\varphi_0^- + \varphi_0^+}{2}\right)\right] =$$

$$2\delta \cdot \sin(n\pi\Delta) \cdot \cos\left(\varphi_0 - \frac{\varphi_0^- + \varphi_0^+}{2}\right) \cdot \left[\sin\left(\omega_m t - \frac{\varphi_0^- - \varphi_0^+}{2}\right) + \right.$$

$$\left.\sin\left(\omega_m t - \omega_m T_1 - \frac{\varphi_0^- - \varphi_0^+}{2}\right)\right] + 2\delta \cdot \cos(n\pi\Delta) \cdot \sin\left(\varphi_0 - \frac{\varphi_0^- + \varphi_0^+}{2}\right) \cdot$$

$$\left[\sin\left(\omega_m t - \frac{\varphi_0^- - \varphi_0^+}{2}\right) - \sin\left(\omega_m t - \omega_m T_1 - \frac{\varphi_0^- - \varphi_0^+}{2}\right)\right] =$$

$$2\delta \cdot \sin(n\pi\Delta) \cdot \cos\left(\varphi_0 - \frac{\varphi_0^- + \varphi_0^+}{2}\right) \cdot \left[\sin\left(\omega_m t - \frac{\varphi_0^- - \varphi_0^+}{2}\right) + \right.$$

$$\left.\sin\left(\omega_m t - \pi + \Delta\pi - \frac{\varphi_0^- - \varphi_0^+}{2}\right)\right] +$$

$$2\delta \cdot \cos(n\pi\Delta) \cdot \sin\left(\varphi_0 - \frac{\varphi_0^- + \varphi_0^+}{2}\right) \cdot$$

$$\left[\sin\left(\omega_m t - \frac{\varphi_0^- - \varphi_0^+}{2}\right) - \sin\left(\omega_m t - \pi + \Delta\pi - \frac{\varphi_0^- - \varphi_0^+}{2}\right)\right] =$$

$$2\delta \cdot \sin(n\pi\Delta) \cdot \cos\left(\varphi_0 - \frac{\varphi_0^- + \varphi_0^+}{2}\right) \cdot \left[\sin\left(\omega_m t - \frac{\varphi_0^- - \varphi_0^+}{2}\right) - \right.$$

$$\left.\sin\left(\omega_m t + \Delta\pi - \frac{\varphi_0^- - \varphi_0^+}{2}\right)\right] +$$

$$2\delta \cdot \cos(n\pi\Delta) \cdot \sin\left(\varphi_0 - \frac{\varphi_0^- + \varphi_0^+}{2}\right) \cdot \left[\sin\left(\omega_m t - \frac{\varphi_0^- - \varphi_0^+}{2}\right) + \right.$$

$$\left.\sin\left(\omega_m t + \Delta\pi - \frac{\varphi_0^- - \varphi_0^+}{2}\right)\right] = -4\delta \cdot \sin(n\pi\Delta) \cdot \cos\left(\varphi_0 - \frac{\varphi_0^- + \varphi_0^+}{2}\right) \cdot$$

-continued
$$\sin\left(\frac{\Delta\pi}{2}\right)\cdot\cos\left(\omega_m t - \frac{\varphi_0^- - \varphi_0^+}{2} + \frac{\Delta\pi}{2}\right) + 4\delta\cdot\cos(n\pi\Delta)\cdot\sin\left(\varphi_0 - \frac{\varphi_0^- + \varphi_0^+}{2}\right)\cdot$$
$$\cos\left(\frac{\Delta\pi}{2}\right)\cdot\sin\left(\omega_m t - \frac{\varphi_0^- - \varphi_0^+}{2} + \frac{\Delta\pi}{2}\right)$$

Therefore,
$$(1+\delta)\cdot[\cos(\omega_m t + \omega_0^- T_1 + n\pi\Delta + \varphi_0 - \varphi_0^-) - \cos(\omega_m t + n\pi\Delta + \varphi_0 - \varphi_0^-)] +$$
$$(1-\delta)\cdot[\cos(-\omega_m t + \omega_0^+ T_1 + n\pi\Delta + \varphi_0 - \varphi_0^+) - \cos(-\omega_m t + n\pi\Delta +$$
$$\varphi_0 - \varphi_0^+)] = -4\cos(\Delta n\pi)\cdot\cos\left(\varphi_0 - \frac{\varphi_0^- + \varphi_0^+}{2}\right)\cdot\cos\left(\frac{\Delta\pi}{2}\right)\cdot$$
$$\cos\left(\omega_m t - \frac{\varphi_0^- - \varphi_0^+}{2} + \frac{\Delta\pi}{2}\right) + 4\sin(\Delta n\pi)\cdot\sin\left(\varphi_0 - \frac{\varphi_0^- + \varphi_0^+}{2}\right)\cdot\sin\left(\frac{\Delta\pi}{2}\right)\cdot$$
$$\sin\left(\omega_m t - \frac{\varphi_0^- - \varphi_0^+}{2} + \frac{\Delta\pi}{2}\right) - 4\delta\cdot\sin(n\pi\Delta)\cdot\cos\left(\varphi_0 - \frac{\varphi_0^- + \varphi_0^+}{2}\right)\cdot\sin\left(\frac{\Delta\pi}{2}\right)\cdot$$
$$\cos\left(\omega_m t - \frac{\varphi_0^- - \varphi_0^+}{2} + \frac{\Delta\pi}{2}\right) + 4\delta\cdot\cos(n\pi\Delta)\cdot\sin\left(\varphi_0 - \frac{\varphi_0^- + \varphi_0^+}{2}\right)\cdot$$
$$\cos\left(\frac{\Delta\pi}{2}\right)\cdot\sin\left(\omega_m t - \frac{\varphi_0^- - \varphi_0^+}{2} + \frac{\Delta\pi}{2}\right) =$$
$$-4\cos\left(\varphi_0 - \frac{\varphi_0^- + \varphi_0^+}{2}\right)\cdot\left[\cos(\Delta n\pi)\cdot\cos\left(\frac{\Delta\pi}{2}\right) + \delta\cdot\sin(n\pi\Delta)\cdot\sin\left(\frac{\Delta\pi}{2}\right)\right]\cdot$$
$$\cos\left(\omega_m t - \frac{\varphi_0^- - \varphi_0^+}{2} + \frac{\Delta\pi}{2}\right) + 4\sin\left(\varphi_0 - \frac{\varphi_0^- + \varphi_0^+}{2}\right)\cdot$$
$$\left[\sin(\Delta n\pi)\cdot\sin\left(\frac{\Delta\pi}{2}\right) + \delta\cdot\cos(n\pi\Delta)\cdot\cos\left(\frac{\Delta\pi}{2}\right)\right]\cdot$$
$$\sin\left(\omega_m t - \frac{\varphi_0^- - \varphi_0^+}{2} + \frac{\Delta\pi}{2}\right) \approx$$
$$-4\cos\left(\varphi_0 - \frac{\varphi_0^- + \varphi_0^+}{2}\right)\cdot\cos(\Delta n\pi)\cdot\cos\left(\frac{\Delta\pi}{2}\right)\cdot\cos\left(\omega_m t + \frac{\Delta\pi}{2} - \frac{\varphi_0^- - \varphi_0^+}{2} + \delta\varphi\right)$$

What is claimed is:

1. A line locator, comprising:
 a plurality of coil detectors, each of the plurality of coil detectors oriented to measure a component of an electromagnetic field, wherein the plurality of coil detectors comprise a first coil detector and a top coil detector;
 circuitry coupled to receive signals from the plurality of coil detectors and provide quadrature signals indicating a complex electromagnetic field strength;
 a position locator for indicating a position of the line locator;
 a processor coupled to receive the complex electromagnetic field strength and the position and calculate values related to a target line;
 a memory configured to store instructions; and
 a display coupled to the processor, the display indicating to a user the values related to the target line,
 wherein the processor executes the instructions for performing the following:
  modeling an expected complex field strength corresponding to complex field strengths and a phase error measured at the plurality of coil detectors at each of a plurality of positions determined by the position locator with the target line and a hypothesized number of bleedover cables to form a set of hypothesized values corresponding to a set of individual models for the target line for each of the hypothesized number of bleedover cables,
  wherein modeling uses a phase error function of locations, current and phase of each line including the target line and the bleedover cables, and an estimation of a current attenuation at two nearest side tones to update a fit factor, the side tones defined by a carrier frequency and a modulation frequency;
  determining which of the set of individual models is a best model; and
  determining parameters related to the target line from the best model.

2. The line locator of claim 1, wherein the parameters related to the target line include at least one estimated value chosen from a list consisting of a centerline position, depth of the target line, and a current carried in the target line.

3. The line locator of claim 1, wherein determining which of the set of individual models is the best model includes applying a cost function to each of the set of individual models and choosing the best model.

4. The line locator of claim 1, further including estimating a confidence interval for the hypothesized values associated with the best model.

5. The line locator of claim 1, wherein the first coil determines a first electromagnetic field and the plurality of coil detectors further comprises a second coil for determining a second electromagnetic field strength from the second coil, the first coil being orthogonal to the second coil.

6. The line locator of claim 5, wherein the plurality of coil detectors includes a third coil for determining a third electromagnetic field, wherein the third coil is oriented orthogonally from the first coil.

7. The line locator of claim 1, wherein the position locator can indicate the position along the plurality of positions positioned along a path determined by inertial tracking.

8. The line locator of claim 1, wherein the position locator can detect pitch, roll, and yaw angles by inertial tracking and the processor can correct the complex electromagnetic field strengths for aberrations that occur while measuring the set of complex electromagnetic field strengths.

9. The line locator of claim 1, wherein modeling expected complex field strengths includes optimizing each of the set of individual models.

10. A method of locating an underground line, comprising: measuring an electromagnetic field using a plurality of coil detectors, each of the plurality of coil detectors oriented to measure a component of an electromagnetic field, wherein the plurality of coil detectors comprise a first coil detector and a top coil detector; modeling, using a processor, a phase error based on the presence of lines neighboring the underground target line, wherein modeling uses a phase error function of locations, current and phases of each line including the underground target line and the neighboring lines, and an estimation of a current attenuation at two nearest side tones to update a fit factor, the side tones defined by a carrier frequency and a modulation frequency; and utilizing the phase error in an enhanced electromagnetic field model to locate the target line.

11. The method of claim 10, further comprising displaying parameters related to the target line.

12. The method of claim 11, further comprising displaying values associated with the set of hypothesized values corresponding to a best model.

13. The method of claim 12, wherein the values includes an indication of a number of neighboring lines utilized in the best model.

14. The method of claim 12, wherein an indication of the relative strength of different directions of detected electromagnetic field.

15. The method of claim 10, where measuring an electromagnetic field includes measuring a set of complex electromagnetic field strengths at a plurality of positions along a path that crosses the underground line.

16. The method of claim 15, wherein modeling the phase error includes modeling an expected complex field strength at each of the plurality of positions with the target line and a hypothesized number of bleedover lines to form a set of hypothesized values corresponding to a set of individual models for the underground line for each of the hypothesized number of bleedover lines.

17. The method of claim 16, further including estimating a confidence interval for the hypothesized values associated with a best model.

18. The method of claim 16, wherein modeling expected complex field strengths includes optimizing each of the set of individual models.

19. The method of claim 18, wherein optimizing includes applying a Levenberg-Marquardt algorithm.

20. The method of claim 16, wherein utilizing the phase error includes determining which of the set of individual models is a best model, and determining parameters related to the target line from the best model.

21. The method of claim 20, wherein the parameters related to the target line include at least one estimated value chosen from a list consisting of at least one of a centerline position, depth of the target line, and a current carried in the target line.

22. The method of claim 20, wherein determining which of the set of individual models is the best model includes:
applying a cost function to each of the set of individual models; and
choosing the best model.

23. The method of claim 22, wherein the cost function includes a penalty for a number of neighboring lines used.

24. The method of claim 22, wherein the cost function includes a mean square error fit to the set of complex electromagnetic field strengths.

25. The method of claim 22, further including rejecting false positive locates due to excessive noise and interference.

26. The method of claim 22, further including optimizing the cost function.

27. The method of claim 26, wherein the optimizing includes applying a global grid search algorithm.

28. The method of claim 26, wherein the optimizing includes applying a minimum norm algorithm.

29. The method of claim 15, wherein measuring a set of complex electromagnetic field strengths includes traversing a handheld locate receiver over the target line by walking.

30. The method of claim 15, wherein measuring a set of complex electromagnetic field strengths includes traversing a handheld locate receiver over the target line by using a pull cart.

31. The method of claim 15, wherein measuring a set of complex electromagnetic field strengths includes determining a first electromagnetic field strength from the first coil and determining a second electromagnetic field strength from a second coil, the first coil being orthogonal to the second coil.

32. The method of claim 31, wherein measuring a set of complex electromagnetic filed strengths includes determining a third electromagnetic field strength from a third coil.

33. The method of claim 31, wherein the first coil and the second coil are oriented in a "V" configuration, with one coil tilted above horizontal and the other tilted below horizontal, both of which are aligned in a direction transverse to a line direction.

34. The method of claim 31, wherein modeling an expected complex field strength includes employing a first field model to estimate the first electromagnetic field strength by adjusting the hypothesized values and employing a second field model to estimate the second electromagnetic field strength by adjusting the hypothesized values.

35. The method of claim 34, further including detecting pitch, roll, and yaw angles by inertial tracking and correcting the complex electromagnetic field strengths for aberrations that occur while measuring the set of complex electromagnetic field strengths.

36. The method of claim 34, wherein a best field model to be utilized for determining the first electromagnetic field strength and the second electromagnetic field strength is chosen for each of the plurality of positions depending on which of the first electromagnetic field strength or second electromagnetic field strength is stronger, thereby avoiding null fields sensed by one of the first coil or the second coil by replacing that complex field measurement with values from an alternative model.

37. The method of claim 36, wherein a dedicated digital phase locked loop operates on the signal from each of the first coil and the second coil, thereby enhancing performance when null fields are sensed by one of the first coil and the second coil and are at a maximum on the other of the first coil and the second coil.

38. The method of claim 15, wherein measuring a set of complex electromagnetic field strengths includes measuring electromagnetic field strengths with three orthogonal coils, and modeling an expected complex field strength includes utilizing a full three-dimensional field model that adjusts the hypothesized values to estimate the complex electromagnetic field strengths.

39. The method of claim 15, wherein the plurality of coils comprise the first coil, the top coil, and two additional coils, the two additional coils oriented orthogonally to each other and to the first coil and the top coil, and measuring a set of complex electromagnetic field strengths includes measuring electromagnetic field strengths and wherein modeling an expected complex field strength includes utilizing a two dimensional field model that relates the set of hypothesized values to generate the expected complex field strength at two of the three orthogonal coils and utilizes a third of the three orthogonal coils to validate that the path is roughly perpendicular to a direction along a length of the target line.

40. The method of claim 15, wherein an amplitude and phase of the complex electromagnetic field strengths are derived from demodulated in-phase and quadrature signals.

41. The method of claim 15, wherein the plurality of positions along the path are determined by inertial tracking.

42. The method of claim 15, wherein the plurality of positions along the path are determined by stereo imaging.

43. The method of claim 15, wherein the plurality of positions along the path are determined by laser or ultrasonic range finding.

44. The method of claim 15, wherein the plurality of positions along the path are determined with a measuring wheel.

45. The method of claim 15, wherein the plurality of positions along the path are determined using remote sensing.

46. The method of claim 45, wherein the remote sensing includes detection of tick marks on a tape measure.

47. The method of claim 45, wherein the remote sensing includes user input that a predetermined measurement position has been reached.

48. The method of claim 10, wherein the plurality of coil detectors further comprises a second coil, and wherein:
the first coil comprises a horizontal coil arranged to detect a horizontal component of an electromagnetic field; and
the second coil comprises a vertical coil arranged to detect a vertical component of the electromagnetic field.

49. The method of claim 10 further including updating the fit factor by using a ratio of the higher frequency to the lower frequency of the two nearest side tones in combination with a slope of the current gain at an integer multiple of the carrier frequency.

50. A line locator, comprising:
- a signal detector to detect signals from an underground line; the signal detector comprising:
- a plurality of coil detectors, each of the plurality of coil detectors oriented to measure a component of an electromagnetic field, wherein the plurality of coil detectors comprise a first coil detector and a top coil detector;
- an error modeler that models a phase error in the signal from neighboring underground lines, wherein the error modeler uses a phase error function of locations, current and phase of each line including the underground line and the neighboring underground lines, and an estimation of a current attenuation at two nearest side tones to update a fit factor, the side tones defined by a carrier frequency and a modulation frequency; and
- an enhanced electromagnetic field modeler that provides a location of the underground line based on the signal and a result from the error modeler.

51. The line locator of claim 50 wherein the fit factor is updated using a ratio of the higher frequency to the lower frequency of the two nearest side tones in combination with a slope of the current gain at an integer multiple of the carrier frequency.

* * * * *